US012512054B2

(12) United States Patent
Yuan et al.

(10) Patent No.: US 12,512,054 B2
(45) Date of Patent: Dec. 30, 2025

(54) DISPLAY PANEL, METHOD FOR DRIVING DISPLAY PANEL, AND DISPLAY APPARATUS

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN); Liu Wu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 18/682,942

(22) PCT Filed: Mar. 24, 2022

(86) PCT No.: PCT/CN2022/082864
§ 371 (c)(1),
(2) Date: Feb. 12, 2024

(87) PCT Pub. No.: WO2023/178621
PCT Pub. Date: Sep. 28, 2023

(65) Prior Publication Data
US 2024/0355286 A1 Oct. 24, 2024

(51) Int. Cl.
*G09G 3/3233* (2016.01)
*G11C 19/28* (2006.01)

(52) U.S. Cl.
CPC ......... *G09G 3/3233* (2013.01); *G11C 19/287* (2013.01); *G09G 2300/0842* (2013.01); *G09G 2310/0286* (2013.01); *G09G 2310/08* (2013.01)

(58) Field of Classification Search
CPC ...... G09G 3/32; G09G 3/3233; G09G 3/3266; G09G 2310/08; G09G 2310/0286; G09G 2300/0842; G11C 19/287
See application file for complete search history.

(56) References Cited

U.S. PATENT DOCUMENTS

2011/0284881 A1* 11/2011 Shikina ................ H10K 59/879 257/E27.121
2013/0314308 A1* 11/2013 Hsu ...................... G09G 3/3233 345/82

(Continued)

*Primary Examiner* — Doon Y Chow
(74) *Attorney, Agent, or Firm* — XSENSUS LLP

(57) ABSTRACT

A display panel includes pixel driving circuits distributed in an array and forming pixel driving circuit groups, each pixel driving circuit group includes pixel driving circuit rows with each including pixel driving circuits, each of which includes a driving circuit connected to a first, second and third nodes, to input a driving current to the third node through the second node in response to a signal of the first node; a first switching unit with a first end connected to a first power supply terminal and second end connected to the second node, to connect the first power supply terminal and the second node in response to a pulse width modulation signal; in a same pixel driving circuit group, a second end of any first switching unit is connected to a second end of at least one first switching unit in each of the other pixel driving circuit rows.

20 Claims, 11 Drawing Sheets

(56) References Cited

U.S. PATENT DOCUMENTS

| | | | | |
|---|---|---|---|---|
| 2015/0187272 | A1* | 7/2015 | Kimura | G09G 3/3233<br>345/694 |
| 2017/0221423 | A1* | 8/2017 | Xiang | G09G 3/3233 |
| 2019/0156744 | A1* | 5/2019 | Song | G09G 3/3266 |
| 2021/0202678 | A1* | 7/2021 | Yuan | G09G 3/006 |
| 2022/0180816 | A1* | 6/2022 | Yuan | G09G 3/3266 |

* cited by examiner

DISPLAY PANEL, METHOD FOR DRIVING DISPLAY PANEL, AND DISPLAY APPARATUS

CROSS-REFERENCE TO RELATED APPLICATION

The present disclosure is a U.S. National Stage of International Application No. PCT/CN2022/082864, filed on Mar. 24, 2022, entitled "DISPLAY PANEL AND DRIVING METHOD THEREFOR, AND DISPLAY DEVICE", the entire content of which is incorporated herein by reference.

TECHNICAL FIELD

The present disclosure relates to a field of display technology, in particular to a display panel, a method for driving a display panel, and a display apparatus.

BACKGROUND

In the related art, a pixel driving circuit typically includes a switching transistor connected between a power supply terminal and a driving transistor, a display panel may adjust brightness of a sub pixel where the pixel driving circuit is located by controlling a duty cycle of a gate electrode pulse width modulation signal of the switching transistor. However, due to the switching transistor being in a turned-on state for a long time, a threshold drift of the switching transistor is severe, which affects the normal display.

It should be noted that the information disclosed in this section is turned only for enhancing understanding of the BACKGROUND of the disclosure and therefore, may contain information that does not constitute the prior art that is already known to those skilled in the art.

SUMMARY

According to an aspect of the present disclosure, a display panel is provided and includes: a plurality of pixel driving circuits distributed in an array along a first direction and a second direction, where the first direction and the second direction intersects, the plurality of pixel driving circuits form a plurality of pixel driving circuit groups, each pixel driving circuit group includes a plurality of pixel driving circuit rows, and the pixel driving circuit row includes a plurality of pixel driving circuits distributed along the first direction, and the pixel driving circuit includes: a driving circuit, connected to a first node, a second node, and a third node, and configured to input a driving current to the third node through the second node in response to a signal of the first node; a first switching unit with a first end connected to a first power supply terminal and a second end connected to the second node, configured to connect the first power supply terminal and the second node in response to a pulse width modulation signal; where in a same pixel driving circuit group, a second end of any one of the first switching units is connected to a second end of at least one of the first switching units in each of the other pixel driving circuit rows.

In an exemplary embodiment, the driving circuit includes: a driving transistor with a first electrode connected to the second node, a second electrode connected to the third node, and a gate electrode connected to the first node; the first switching unit includes: a first transistor with a first electrode connected to the first power supply terminal, a second electrode connected to the second node, and a gate electrode connected to a pulse width modulation signal terminal; the pixel driving circuit further includes: a second transistor, with a first electrode connected to a data signal terminal, a second electrode connected to the first node, and a gate electrode connected to a first gate electrode driving signal terminal; a third transistor, with a first electrode connected to the third node, a second electrode connected to a sensing signal terminal, and a gate electrode connected to a second gate electrode driving signal terminal; and a capacitor connected between the first node and the third node.

In an exemplary embodiment, the display panel further includes: a gate electrode driving circuit, where the gate electrode driving circuit includes a plurality of output terminals, the output terminal is provided in correspondence with the pixel driving circuit row, and configured to provide the pulse width modulation signal to a control terminal of the first switching unit in a pixel driving circuit row corresponding to the output terminal; the gate electrode driving circuit is configured to provide the pulse width modulation signal to a pixel driving circuit subgroup in a same pixel driving circuit group in a same frame, a part of the pixel driving circuit rows in the pixel driving circuit group form the pixel driving circuit subgroup, and the gate electrode driving circuit is configured to provide the pulse width modulation signal to different pixel driving circuit subgroups of the same pixel driving circuit group in at least a part of different frames.

In an exemplary embodiment, the pixel driving circuit group includes a plurality of pixel driving circuit rows adjacent to each other in the second direction, and in a same pixel driving circuit group, the second ends of the first switching units of the plurality of pixel driving circuits distributed in the second direction are connected to each other.

In an exemplary embodiment, the pixel driving circuit subgroup includes one pixel driving circuit row, the pixel driving circuit group includes an odd-numbered pixel driving circuit row located in an odd row and an even-numbered pixel driving circuit row located in an even row, and two pixel driving circuit rows in the pixel driving circuit group are adjacent to each other in the second direction; the gate electrode driving circuit is configured to provide the pulse width modulation signal to the odd-numbered pixel driving circuit row or the even-numbered pixel driving circuit row in the same frame, and the gate electrode driving circuit is configured to provide the pulse width modulation signal to the odd-numbered pixel driving circuit row in at least a part of the frames, and to provide the pulse width modulation signal to the even-numbered pixel driving circuit row in at least a part of the frames.

In an exemplary embodiment, the gate electrode driving circuit includes: a first gate electrode driving circuit, connected to a first signal input line, a first clock signal line, and a second clock signal line, and configured to provide the pulse width modulation signal to the odd-numbered pixel driving circuit row in response to signals of the first signal input line, the first clock signal line, and the second clock signal line; and a second gate electrode driving circuit, connected to a second signal input line, the first clock signal line, and the second clock signal line, and configured to provide the pulse width modulation signal to the even-numbered pixel driving circuit row in response to signals of the second signal input line, the first clock signal line, and the second clock signal line.

In an exemplary embodiment, the first gate electrode driving circuit includes a plurality of shift register units cascaded, and the second gate electrode driving circuit includes a plurality of shift register units cascaded; the shift register unit includes: a first input circuit, connected to a signal input terminal, a first clock signal terminal, and a fourth node, and configured to transmit a signal of the signal input terminal to the fourth node in response to a signal of the first clock signal terminal; a second input circuit, connected to a second power supply terminal, a second clock signal terminal, a fifth node, and the signal input terminal, where the second input circuit is configured to transmit a signal of the second power supply terminal to the fifth node in response to a signal of the second clock signal terminal, and configured to transmit the signal of the second clock signal terminal to the fifth node in response to the signal of the signal input terminal; a pull-up circuit, connected to the first clock signal terminal, the fifth node, and a sixth node, and configured to transmit the signal of the first clock signal terminal to the sixth node in response to a signal of the fifth node and the signal of the first clock signal terminal; a pull-down circuit, connected to the fourth node, a third power supply terminal, and the sixth node, and configured to transmit a signal of the third power supply terminal to the sixth node in response to a signal of the fourth node; a first output circuit, connected to the fourth node, a first output terminal, and a second power supply terminal, configured to transmit the signal of the second power supply terminal to the first output terminal in response to the signal of the fourth node; and a second output circuit, connected to the sixth node, the third power supply terminal, and the first output terminal, and configured to transmit the signal of the third power supply terminal to the first output terminal in response to a signal of the sixth node.

In an exemplary embodiment, the first input circuit includes: a fourth transistor, with a first electrode connected to the signal input terminal, a second electrode connected to a seventh node, and a gate electrode connected to the first clock signal terminal; a fifth transistor, with a first electrode connected to the seventh node, a second electrode connected to the fourth node, and a gate electrode connected to the first clock signal terminal; the second input circuit includes: a seventh transistor, with a first electrode connected to the second power supply terminal, a second electrode connected to the fifth node, and a gate electrode connected to the second clock signal terminal; an eighth transistor, with a first electrode connected to the fifth node, a second electrode connected to an eighth node, and a gate electrode connected to the signal input terminal; and a ninth transistor, with a first electrode connected to the eighth node, a second electrode connected to the second clock signal terminal, and a gate electrode connected to the signal input terminal.

In an exemplary embodiment, the shift register unit further includes: a first isolation circuit, connected to the second power supply terminal, the fourth node, and the seventh node, and configured to transmit the signal of the second power supply terminal to the seventh node in response to the signal of the fourth node; and a second isolation circuit, connected to the eighth node, the second power supply terminal, and the fifth node, and configured to transmit the signal of the second power supply terminal to the eighth node in response to the signal of the fifth node.

In an exemplary embodiment, the first isolation circuit includes: a sixth transistor, with a first electrode connected to the seventh node, a second electrode connected to the second power supply terminal, and a gate electrode connected to the fourth node; the second isolation circuit includes: a tenth transistor, with a first electrode connected to the second power supply terminal, a second electrode connected to the eighth node, and a gate electrode connected to the fifth node.

In an exemplary embodiment, the pull-up circuit includes: an eleventh transistor, with a first electrode connected to the first clock signal terminal, a second electrode connected to the ninth node, and a gate electrode connected to the fifth node; a twelfth transistor, with a first electrode connected to the ninth node, a second electrode connected to the sixth node, and a gate electrode connected to the first clock signal terminal; and a first capacitor, connected to the fifth node; the pull-down circuit includes: a thirteenth transistor, with a first electrode connected to the third power supply terminal, a second electrode connected to the sixth node, and a gate electrode connected to the fourth node.

In an exemplary embodiment, the first output circuit is further connected to a second output terminal, and configured to transmit the signal of the second power supply terminal to the second output terminal in response to the signal of the fourth node; the second output circuit is further connected to the second output terminal and a fourth power supply terminal, and configured to transmit a signal of the fourth power supply terminal to the second output terminal in response to the signal of the sixth node; the first output terminal or the second output terminal forms an output terminal of the gate electrode driving circuit.

In an exemplary embodiment, active driving levels of the first input circuit, the second input circuit, the pull-up circuit, the first output circuit, and the second output circuit are high levels; the second power supply terminal is a high-level signal terminal, the fourth power supply terminal and the third power supply terminal are both low-level signal terminals, and a voltage of the third power supply terminal is less than a voltage of the fourth power supply terminal.

In an exemplary embodiment, the first output circuit includes: a fourteenth transistor, with a first electrode connected to the second power supply terminal, a second electrode connected to the first output terminal, and a gate electrode connected to the fourth node; a fifteenth transistor, with a first electrode connected to the second power supply terminal, a second electrode connected to the second output terminal, and a gate electrode connected to the fourth node; a second capacitor, connected to the fourth node; the second output circuit includes: a sixteenth transistor, with a first electrode connected to the third power supply terminal, a second electrode connected to the first output terminal, and a gate electrode connected to the sixth node; a seventeenth transistor, with a first electrode connected to the fourth power supply terminal, a second electrode connected to the second output terminal, and a gate electrode connected to the sixth node; and a third capacitor, connected to the sixth node.

In an exemplary embodiment, the second output circuit includes: a sixteenth transistor, with a first electrode connected to the seventh node, a second electrode connected to the first output terminal, and a gate electrode connected to the sixth node; a twenty-fifth transistor, with a first electrode connected to the seventh node, a second electrode connected to the third power supply terminal, and a gate electrode connected to the sixth node; and a third capacitor, connected to the sixth node.

In an exemplary embodiment, the shift register unit further includes: a reset circuit, connected to the fourth node, the first clock signal terminal, a reset signal terminal, the second power supply terminal, and the sixth node, and configured to transmit the signal of the first clock signal terminal to the fourth node in response to a signal of the reset signal terminal, and to transmit the signal of the second power supply terminal to the sixth node in response to the signal of the reset signal terminal.

In an exemplary embodiment, the first input circuit includes: a fourth transistor, with a first electrode connected to the signal input terminal, a second electrode connected to the seventh node, and a gate electrode connected to the first clock signal terminal; a fifth transistor, with a first electrode connected to the seventh node, a second electrode connected to the fourth node, and a gate electrode connected to the first clock signal terminal; the shift register unit further includes: a first isolation circuit, connected to the second power supply terminal, the fourth node, and the seventh node, and configured to transmit the signal of the second power supply terminal to the seventh node in response to the signal of the fourth node; the reset circuit includes: an eighteenth transistor, with a first electrode connected to the fourth node, a second electrode connected to a tenth node, and a gate electrode connected to the reset signal terminal; a nineteenth transistor, with a first electrode connected to the tenth node, a second electrode connected to the first clock signal terminal, and a gate electrode connected to the reset signal terminal; and a twentieth transistor, with a first electrode connected to the second power supply terminal, a second electrode connected to the sixth node, and a gate electrode connected to the reset signal terminal; where the seventh node is connected to the tenth node.

In an exemplary embodiment, in the first gate electrode driving circuit: a first output terminal of a current stage of the shift register unit is connected to a signal input terminal of a next stage of the shift register unit adjacent to the current stage of the shift register unit; the first signal input line is connected to a signal input terminal of a first stage of the shift register unit in the first gate electrode driving circuit; the first clock signal line is connected to a first clock signal terminal of an odd-numbered stage shift register unit and a second clock signal terminal of an even-numbered stage shift register unit in the first gate electrode driving circuit, and the second clock signal line is connected to a first clock signal terminal of the even-numbered stage shift register unit and a second clock signal terminal of the odd-numbered stage shift register unit in the first gate electrode driving circuit; in the second gate electrode driving circuit: a first output terminal of a current stage of the shift register unit is connected to a signal input terminal of a next stage of the shift register unit adjacent to the current stage of the shift register unit; the second signal input line is connected to a signal input terminal of a first stage of the shift register unit in the second gate electrode driving circuit; the first clock signal line is connected to a first clock signal terminal of an odd-numbered stage shift register unit and a second clock signal terminal of an even-numbered stage shift register unit in the second gate electrode driving circuit, and the second clock signal line is connected to a first clock signal terminal of the even-numbered stage shift register unit and a second clock signal terminal of the odd-numbered stage shift register unit in the second gate electrode driving circuit.

In an exemplary embodiment, the gate electrode driving circuit includes: a plurality of shift register units cascaded, where the shift register unit is provided in correspondence with the pixel driving circuit group and configured to output the pulse width modulation signal through an output terminal; a plurality of output control circuits, where the output control circuit is provided in correspondence with the shift register unit, and the output control circuit is connected to the output terminal of of a corresponding shift register unit, a fifth power supply terminal, a first control signal terminal, a second control signal terminal, a third output terminal, and a fourth output terminal, the output control circuit is configured to transmit the pulse width modulation signal of the output terminal of the shift register unit to the third output terminal in response to a signal of the first control signal terminal, and to transmit a signal of the fifth power supply terminal to the fourth output terminal in response to the signal of the first control signal terminal, the output control circuit is further configured to transmit the pulse width modulation signal of the output terminal of the shift register unit to the fourth output terminal in response to a signal of the second control signal terminal, and to transmit the signal of the fifth power supply terminal to the third output terminal in response to the signal of the second control signal terminal; the third output terminal and the fourth output terminal form an output terminal of the gate electrode driving circuit, the third output terminal is configured to provide the pulse width modulation signal to an odd-numbered pixel driving circuit row corresponding to the output control circuit, and the fourth output terminal is configured to provide the pulse width modulation signal to an even-numbered pixel driving circuit row corresponding to the output control circuit.

In an exemplary embodiment, the output control circuit includes: a twenty-first transistor, with a first electrode connected to the output terminal of the corresponding shift register unit, a second electrode connected to the third output terminal, and a gate electrode connected to the first control signal terminal; a twenty-second transistor, with a first electrode connected to the output terminal of the corresponding shift register unit, a second electrode connected to the fourth output terminal, and a gate electrode connected to the second control signal terminal; a twenty-third transistor, with a first electrode connected to the fifth power supply terminal, a second electrode connected to the third output terminal, and a gate electrode connected to the second control signal terminal; and a twenty-fourth transistor with a first electrode connected to the fifth power supply terminal, a second electrode connected to the fourth output terminal, and a gate electrode connected to the first control signal terminal.

According to an aspect of the present disclosure, a method for driving a display panel is provided, where the method for driving the display panel is configured to drive the above display panel, and the method for driving the display panel includes:

providing the pulse width modulation signal to the pixel driving circuit subgroup in the same pixel driving circuit group in the same frame, where a part of the pixel driving circuit rows form the pixel driving circuit subgroup, and providing the pulse width modulation signal to different pixel driving circuit subgroups in the same pixel driving circuit group in at least a part of different frames.

According to an aspect of the present disclosure, a display apparatus is provided and includes the above display panel.

It should be understood that the preceding general description and the following detailed description are exemplary and explanatory only and are not restrictive of the present disclosure.

BRIEF DESCRIPTION OF THE DRAWINGS

The drawings herein are incorporated into the specification and constitute a part of the specification, show embodiments in accordance with the disclosure, and explain the principle of the disclosure together with the specification.

The drawings in the following description are only some embodiments of the present disclosure. For those of ordinary skill in the art, other drawings may be obtained based on these drawings without creative work.

DETAILED DESCRIPTION

Figure 1:
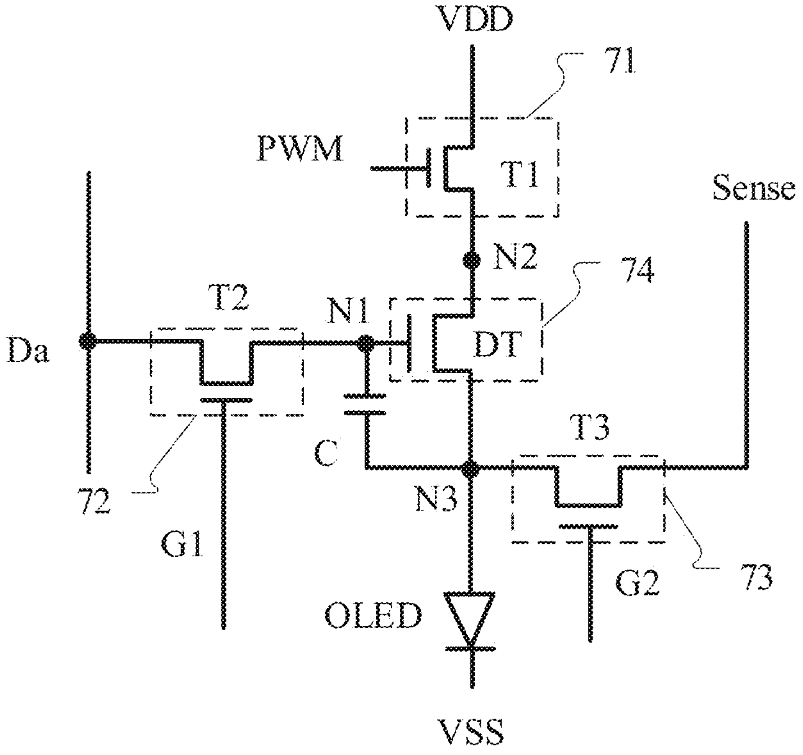
FIG. 1 is a structural diagram of a pixel driving circuit in the related art.

Example embodiments will now be described more fully with reference to the accompanying drawings. Example embodiments, however, may be embodied in various forms and should not be construed as being limited to the examples set forth herein. Rather, these embodiments are provided so that the present disclosure will be thorough and complete, and will fully convey the concept of example embodiments to a person skilled in the art. The same reference numerals in the drawings denote the same or similar structures, and thus their detailed descriptions will be omitted herein.

The terms “a”, “an”, “the” are used to indicate the presence of one or more elements/components/etc.; and the terms “including” and “having” are used to indicate an open-ended inclusive meaning and refer to that additional elements/components/etc. may be present in addition to the listed elements/components/etc.

As shown in FIG. 1, it is a schematic diagram of a pixel driving circuit in the related art. The pixel driving circuit may include a driving circuit 74, a first switching unit 71, a second switching unit 72, a third switching unit 73, and a capacitor C. The driving circuit is connected to a first node N1, a second node N2, and a third node N3, and is configured to input a driving current to the third node N3 through the second node N2 in response to a signal of the first node N1; a first end of the first switching unit 71 is connected to a first power supply terminal VDD, a second end of the first switching unit 71 is connected to the second node N2, and a control end of the first switching unit 71 is connected to a pulse width modulation signal terminal PWM, and is configured to connect the first power supply terminal VDD and the second node N2 in response to a pulse width modulation signal of the pulse width modulation signal terminal PWM; the second switching unit 72 is connected to a data signal terminal Da, the first node N1, and a first gate electrode driving signal terminal G1, and is configured to connect the first node N1 and the data signal terminal Da in response to a signal of the first gate electrode driving signal terminal G1; a third switching unit 73 is connected to the third node N3, a sensing signal terminal Sense, and a second gate electrode driving signal terminal G2, and is configured to connect the third node N3 and the sensing signal terminal Sense in response to a signal of the second gate electrode driving signal terminal G2; the capacitor C is connected between the first node N1 and the third node N3. The third node N3 is configured to connect a first electrode of a light-emitting unit OLED, and the other electrode of the light-emitting unit OLED may be connected to a sixth power supply terminal VSS.

As shown in FIG. 1, the driving circuit 74 may include: a driving transistor DT, with a first electrode of the driving transistor DT connected to the second node N2, a second electrode connected to the third node N3, and a gate electrode connected to the first node N1; the first switching unit 71 may include: a first transistor T1, with a first electrode of the first transistor T1 connected to the first power supply terminal VDD, a second electrode connected to the second node N2, and a gate electrode connected to the pulse width modulation signal terminal PWM. The second switching unit 72 may include: a second transistor T2, with a first electrode of the second transistor T2 connected to the data signal terminal Da, a second electrode connected to the first node N1, and a gate electrode connected to the first gate electrode driving signal terminal G1. The third switching unit 73 may include a third transistor T3, with a first electrode of the third transistor T3 connected to the third node N3, a second electrode connected to the sensing signal terminal Sense, and a gate electrode connected to the second gate electrode driving signal terminal G2. The first transistor T1, the second transistor T2, and the third transistor T3 may all be N-type transistors. The first power supply terminal VDD may be a high-level power supply terminal, and the sixth power supply terminal VSS may be a low-level power supply terminal.

As shown in FIG. 1, the pixel driving circuit may turn on the second transistor T2 during a data writing stage, and write a data signal to the first node N1 through the data signal terminal Da; in a light-emitting stage, the first transistor T1 is turned on through the pulse width modulation signal of the pulse width modulation signal terminal PWM, to connect the first power supply terminal VDD and the second node, the driving transistor DT provides a driving current to the third node N3 according to a voltage of the first node N1 to drive the light-emitting unit OLED to emit light. The display panel may adjust the brightness of the light-emitting unit OLED by adjusting a duty cycle of the pulse width modulation signal. However, since the first transistor T1 is in a turned-on state for a long time, it may cause severe threshold drift of the first transistor T1, which in turn affects the display effect.

Figure 2:
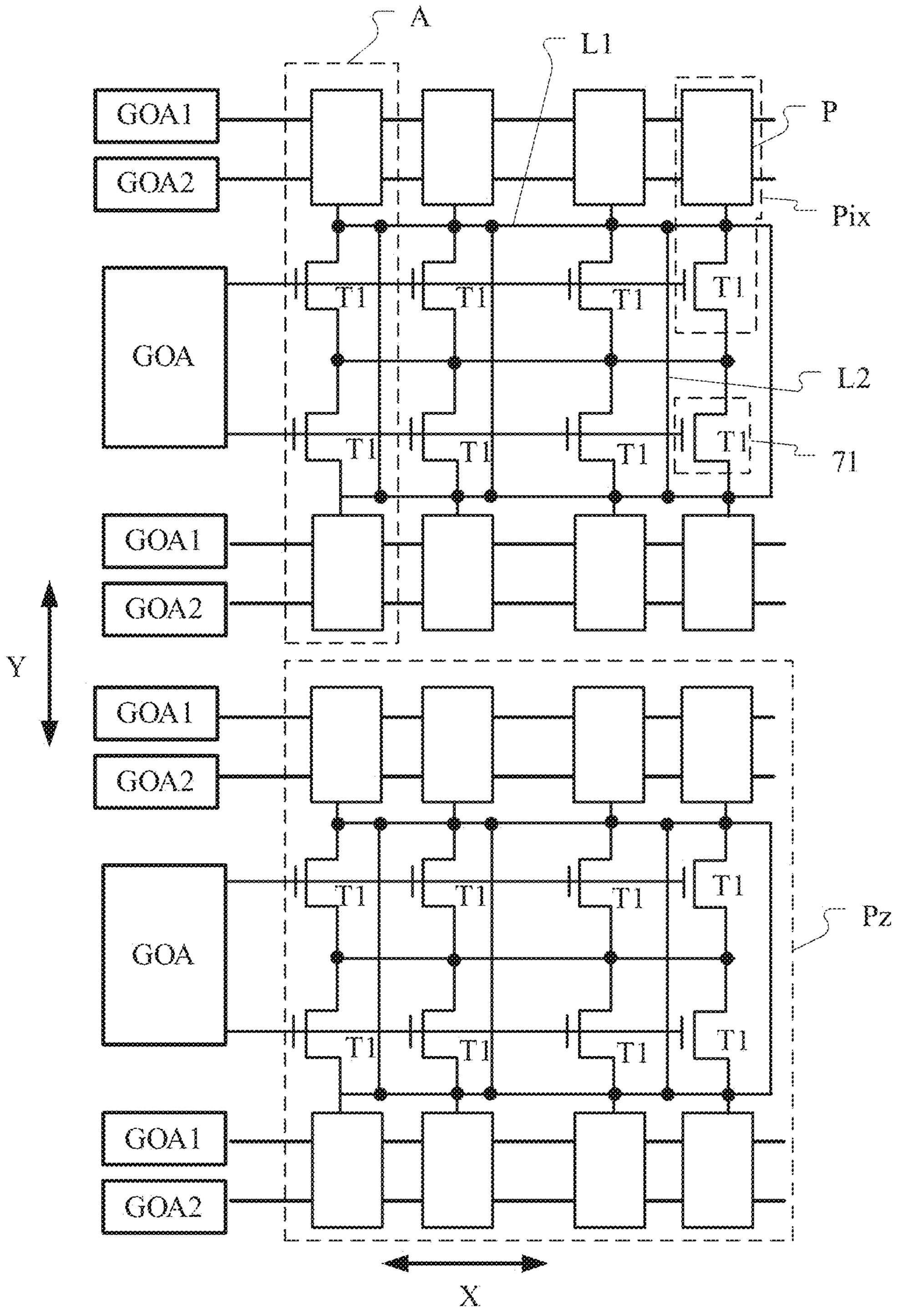
FIG. 2 is a structural diagram of an exemplary embodiment of a display panel of the present disclosure.
Figure 3:
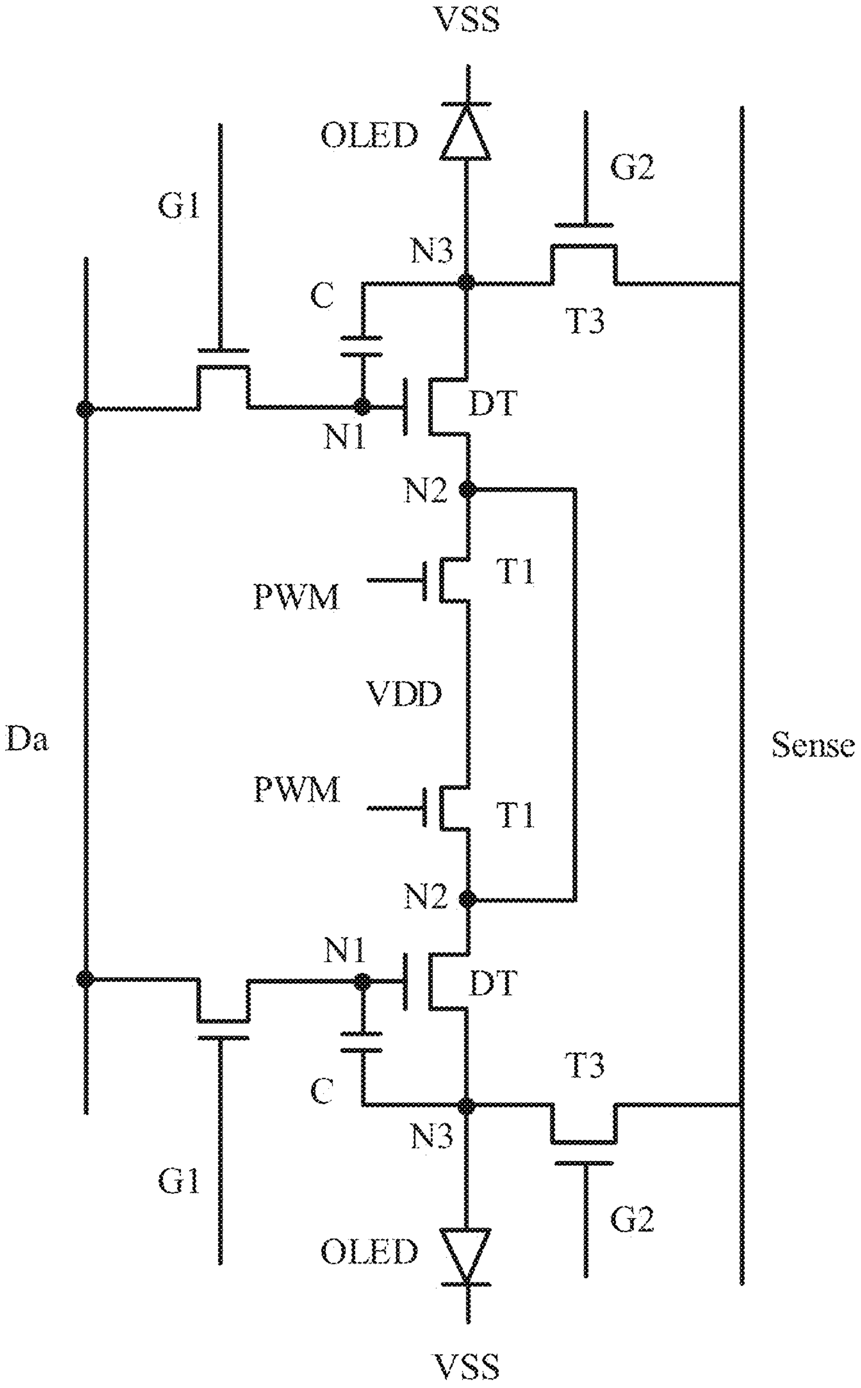
FIG. 3 is a complete structural diagram of a region A in FIG. 2.

Based on the above, the present exemplary embodiment provides a display panel, as shown in FIGS. 2 and 3. FIG. 2 is a structural diagram of an exemplary embodiment of a display panel of the present disclosure, and FIG. 3 is a complete structural diagram of a region A in FIG. 2. The display panel may include a plurality of pixel driving circuits Pix, which may be shown in FIG. 1. FIG. 2 shows a first switching unit 71 in the pixel driving circuit and other circuit structures P in the pixel driving circuit. A plurality of pixel driving circuits Pix are arranged in an array along a first direction X and a second direction Y, and the first direction X and the second direction Y intersect. For example, the first direction X may be a row direction, and the second direction Y may be a column direction. The plurality of pixel driving circuits Pix may form a plurality of pixel driving circuit groups Pz, which may include an odd-numbered pixel driving circuit row located in an odd row and an even-numbered pixel driving circuit row located in an even row, and two pixel driving circuit rows in the pixel driving circuit group Pz may be adjacent in the second direction Y. The pixel driving circuit row includes a plurality of pixel driving circuits Pix distributed along the first direction. As shown in FIGS. 2 and 3, in the same pixel driving circuit group Pz, second ends of the first switching units 71 in two pixel driving circuits distributed in the second direction Y are connected to each other.

In the present exemplary embodiment, the display panel may provide the pulse width modulation signal to either of the two pixel driving circuit rows in the same pixel driving circuit group in the same frame, and provide the pulse width modulation signal to different pixel driving circuit rows in the same pixel driving circuit group in at least a part of different frames. For example, the display panel may provide the pulse width modulation signal to the odd-numbered pixel driving circuit row during a first driving period, and the first switching unit 71 in the odd-numbered pixel driving circuit row is turned on, and the first power supply VDD provides a power voltage to the second node N2 in the odd-numbered pixel driving circuit row and the second node N2 in the even-numbered pixel driving circuit row through the first switching unit 71 in the odd-numbered pixel driving circuit row, respectively, and thus, the odd-numbered pixel driving circuit row and the even-numbered pixel driving circuit row may simultaneously enter the light-emitting stage. The display panel may provide the pulse width modulation signal to the even-numbered pixel driving circuit row during a second driving period, the first switching unit 71 in the even-numbered pixel driving circuit row is turned on, and the first power supply VDD provides a power voltage to the second node N2 in the odd-numbered pixel driving circuit row and the second node N2 in the even-numbered pixel driving circuit row through the first switching unit 71 in the even-numbered pixel driving circuit row, respectively, and thus, the odd-numbered pixel driving circuit row and the even-numbered pixel driving circuit row may simultaneously enter the light-emitting stage. In the present exemplary embodiment, during the first driving period, the first switching unit in the even-numbered pixel driving circuit row is not turned on, and the first switching unit in the even-numbered pixel driving circuit row may perform threshold recovery during this period, during the second driving period, the first switching unit in the odd-numbered pixel driving circuit row is not turned on, and the first switching unit in the odd-numbered pixel driving circuit row may perform threshold recovery during this period. Thus, the display panel may improve the problem of threshold drift of the first switching unit mentioned above. The first driving period and the second driving period may include one or more frames.

As shown in FIG. 2, the display panel may further include a gate electrode driving circuit GOA1 and a gate electrode driving circuit GOA2. The gate electrode driving circuit GOA1 May be configured to provide a gate electrode driving signal row by row to the first gate electrode driving signal terminal G1 in the pixel driving circuit. The gate electrode driving circuit GOA2 may be configured to provide a gate electrode driving signal row by row to the second gate electrode driving signal terminal G2 in the pixel driving circuit.

As shown in FIG. 2, the display panel may further include a gate electrode driving circuit GOA, which may include a plurality of output terminals provided in correspondence with the pixel driving circuit rows. The output terminal is configured to provide the pulse width modulation signal to a control terminal of the first switching unit 71 in a corresponding pixel driving circuit row. The gate electrode driving circuit GOA may be configured to provide the pulse width modulation signal to either the odd-numbered pixel driving circuit row or the even-numbered pixel driving circuit row in the same frame, and the gate electrode driving circuit may be configured to provide the pulse width modulation signal to the odd-numbered pixel driving circuit row in at least a part of the frames, and to provide the pulse width modulation signal to the even-numbered pixel driving circuit row in at least a part of the frames.

In the present exemplary embodiment, as shown in FIG. 2, the second ends of the first switching units 71 in the same pixel driving circuit row may be connected through a first connection line L1. In the same pixel driving circuit group, the second ends of the first switching units in two pixel driving circuits distributed adjacent to each other in the second direction Y may be connected through a second connection line L2. The first connection line L1 and the second connection line L2 are intersected to each other to form a grid structure, which May reduce a potential difference of the second nodes in different pixel driving circuits. It should be understood that in other exemplary embodiments, the display panel may further only be provided with the second connection line L2. In addition, in other exemplary embodiments, in the same pixel driving circuit group, a second end of any one of the first switching units may be connected to a second end of the first switching unit in the pixel driving circuit at any position in another pixel driving circuit row. For example, in the same pixel driving circuit group, the second end of the first switching unit in a first column of the pixel driving circuit in the odd-numbered pixel driving circuit row may be connected to the second end of the first switching unit in a second column of the pixel driving circuit in the even-numbered pixel driving circuit row.

Figure 4:
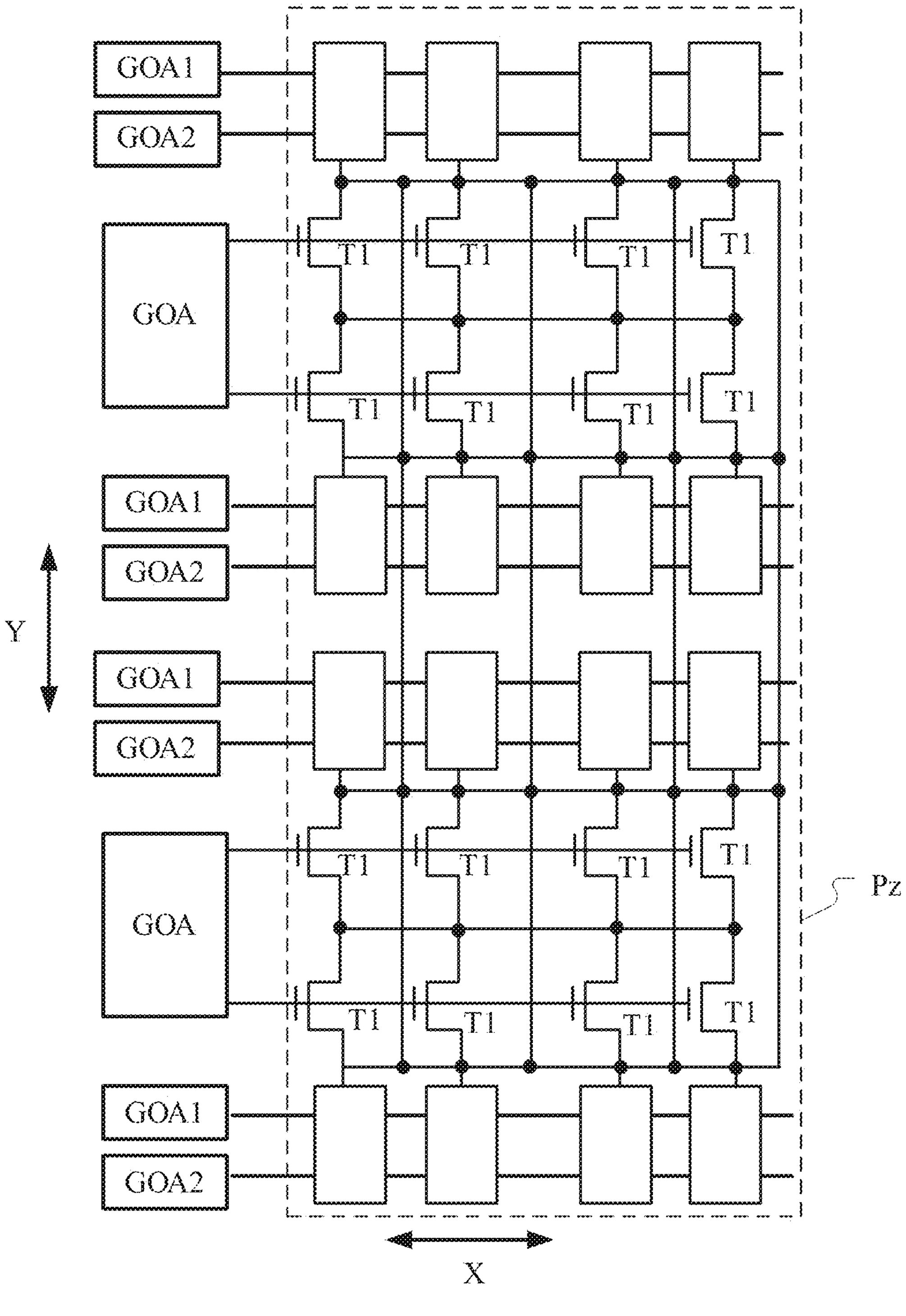
FIG. 4 is a structural diagram of another exemplary embodiment of a display panel of the present disclosure.

In other exemplary embodiments, the pixel driving circuit group Pz may further include other numbers of pixel driving circuit rows, and the plurality of pixel driving circuit rows in the same pixel driving circuit group Pz may be adjacent to each other. As shown in FIG. 4, it is a structural diagram of another exemplary embodiment of a display panel of the present disclosure. The pixel driving circuit group Pz may include four pixel driving circuit rows. In the same pixel driving circuit group Pz, the second end of any one of the first switching units 71 is connected to the second end of at least one of the first switching units 71 in each of the other pixel driving circuit rows. The gate electrode driving circuit GOA may be configured to provide the pulse width modulation signal to a pixel driving circuit subgroup in the same pixel driving circuit group in the same frame, and a part of pixel driving circuit rows in the pixel driving circuit group form the pixel driving circuit subgroup, and the gate electrode driving circuit is configured to provide the pulse width modulation signal to different pixel driving circuit subgroups of the same pixel driving circuit group in at least a part of different frames. The pixel driving circuit subgroup may include one or more pixel driving circuit rows. For example, when a pixel driving circuit subgroup includes one pixel driving circuit row, the display panel may provide the pulse width modulation signal to each pixel driving circuit row in the same pixel driving circuit group during different driving periods, such that different pixel driving circuit rows turn on the first switching unit therein in different time periods, thereby providing sufficient recovery time for the first switching unit. The aforementioned driving period may include one or more frames. When the pixel driving circuit subgroup includes a plurality of pixel driving circuit rows, different pixel driving circuit subgroups may have different combinations of pixel driving circuit rows. For example, during the first driving period, the pulse width modulation signal may be provided to a pixel driving circuit row located in a first row and a pixel driving circuit row located in a second row of the same pixel driving circuit group, during the second driving period, the pulse width modulation signal may be provided to a pixel driving circuit row located in a second row and a pixel driving circuit row located in a third row of the same pixel driving circuit group; and during the third driving period, the pulse width modulation signal may be provided to a pixel driving circuit row located in a third row and a pixel driving circuit row located in a fourth row of the same pixel driving circuit group, and this setting may also reserve sufficient recovery time for the first switching unit. In addition, in other exemplary embodiments, the pixel driving circuit in the display panel of the present disclosure may further be of other structures, as long as the pixel driving circuit includes a first switching unit connected between the driving transistor and a high-level power supply terminal, the pixel driving circuit may improve the threshold drift of the first switching unit through the above settings.

Figure 5:
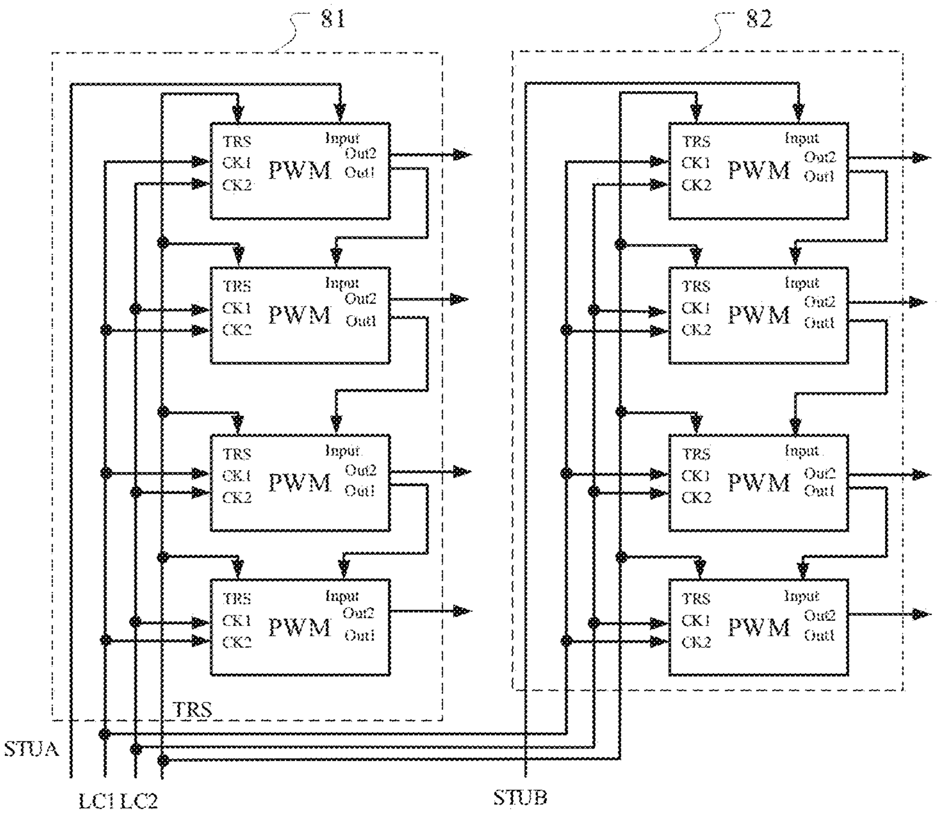
FIG. 5 is a schematic diagram of a gate electrode driving circuit GOA in FIG. 2.

In the present exemplary embodiment, as shown in FIG. 5, it is a schematic diagram of a gate electrode driving circuit GOA in FIG. 2. The gate electrode driving circuit may include: a first gate electrode driving circuit 81, a second gate electrode driving circuit 82, the first gate electrode driving circuit 81 is connected to a first signal input line STUA, a first clock signal line LC1, and a second clock signal line LC2, and is configured to provide the pulse width modulation signal to the odd-numbered pixel driving circuit row in response to signals of the first signal input line STUA, the first clock signal line LC1, and the second clock signal line LC2; the second gate electrode driving circuit 82 is connected to a second signal input line STUB, the first clock signal line LC1, and the second clock signal line LC2, and is configured to provide the pulse width modulation signal to the even-numbered pixel driving circuit in response to signals of the second signal input line STUB, the first clock signal line LC1, and the second clock signal line LC2.

Figure 6A:
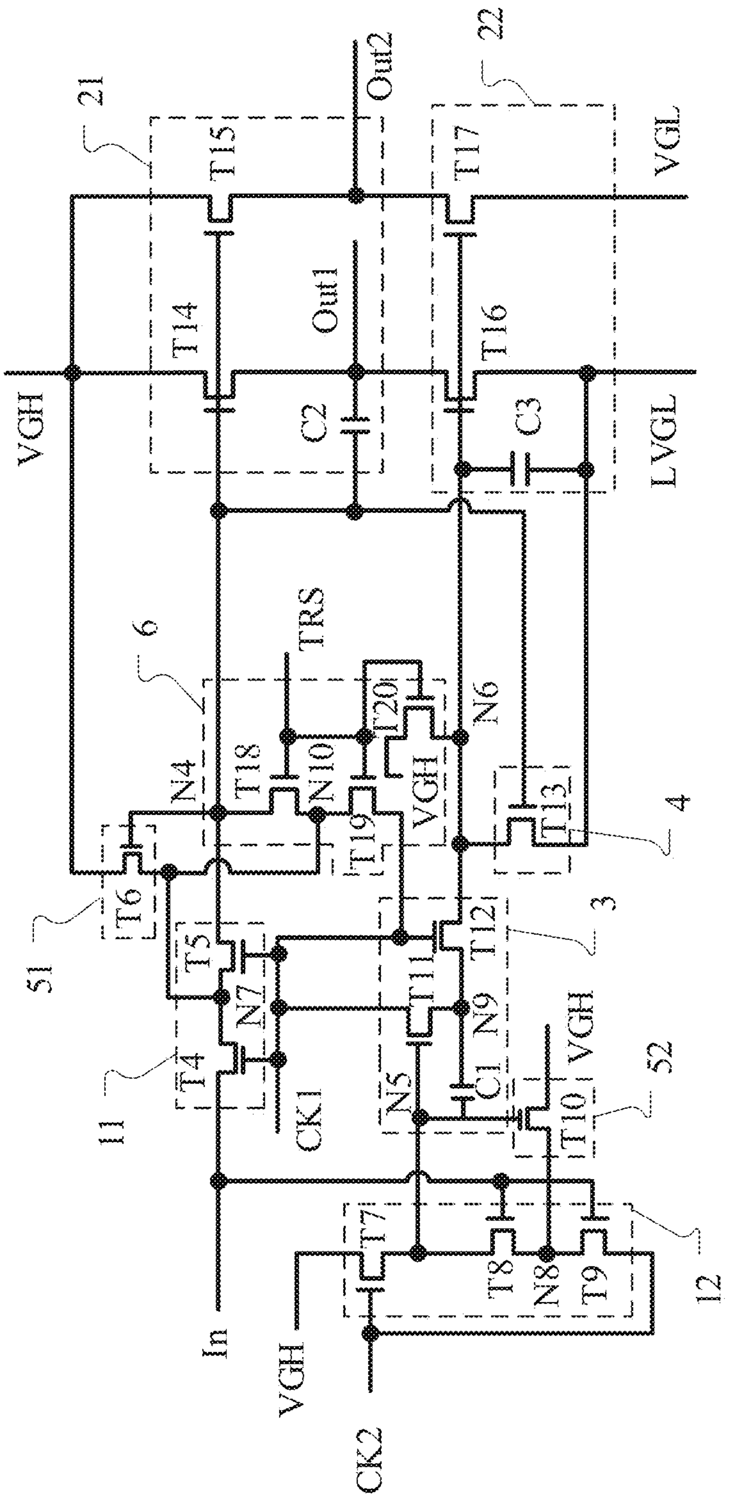
FIG. 6*a* is a structural diagram of an exemplary embodiment of a shift register unit in FIG. 5.

In the present exemplary embodiment, as shown in FIG. 5, the first gate electrode driving circuit 81 may include a plurality of shift register units PWM cascaded, and the second gate electrode driving circuit 82 may include a plurality of shift register units PWM cascaded. As shown in FIG. 6*a*, it is a schematic diagram of an exemplary embodiment of a shift register unit in FIG. 5. The shift register unit may include: a first input circuit 11, a second input circuit 12, a pull-up circuit 3, a pull-down circuit 4, a first output circuit 21, and a second output circuit 22. The first input circuit 11 is connected to a signal input terminal In, a first clock signal terminal CK1, and a fourth node N4, and is configured to transmit a signal of the signal input terminal In to the fourth node N4 in response to a signal of the first clock signal terminal CK1; the second input circuit 12 is connected to a second power supply terminal VGH, a second clock signal terminal CK2, a fifth node N5, and the signal input terminal In, and is configured to transmit a signal of the second power supply terminal VGH to the fifth node N5 in response to a signal of the second clock signal terminal CK2, and is configured to transmit the signal of the second clock signal terminal CK2 to the fifth node N5 in response to the signal of the signal input terminal In; the pull-up circuit 3 is connected to the first clock signal terminal CK1, the fifth node N5, and a sixth node N6, and is configured to transmit the signal of the first clock signal terminal CK1 to the sixth node N6 in response to signals of the fifth node N5 and the first clock signal terminal CK1; the pull-down circuit 4 is connected to the fourth node N4, a third power supply terminal LVGL, and the sixth node N6, and is configured to transmit a signal of the third power supply terminal LVGL to the sixth node N6 in response to a signal of the fourth node N4; the first output circuit 21 is connected to the fourth node N4, the first output terminal Out1, and the second power supply terminal VGH, and is configured to transmit the signal of the second power supply terminal VGH to the first output terminal Out1 in response to the signal of the fourth node N4; the second output circuit 22 is connected to the sixth node N6, the third power supply terminal LVGL, and the first output terminal Out1, and is configured to transmit the signal of the third power supply terminal LVGL to the first output terminal Out1 in response to a signal of the sixth node N6.

In the present exemplary embodiment, the second power supply terminal VGH may be an active level terminal, and the third power supply terminal LVGL may be an inactive level terminal. The method for driving the shift register unit may include seven stages. The shift register unit may input an active level to the first clock signal terminal Ck1, an invalid level to the second clock signal terminal CK2 and a signal input terminal In in a first stage. The active level is a potential that may drive a target circuit to operate normally. In the first stage, the first input circuit 11 transmits the invalid level of the signal input terminal In to the fourth node N4 under the action of the first clock signal terminal CK1. The fifth node N5 maintains the active level of the previous stage, and the pull-up circuit 3 transmits the active level of the first clock signal terminal CK1 to the sixth node N6 under the action of the active levels of the fifth node N5 and the first clock signal terminal CK1. The second output circuit 22 transmits the invalid level of the third power supply terminal LVGL to the first output terminal Out1 under the action of the active level of the sixth node N6. In a second stage, the active level may be input to the second clock signal terminal CK2, the invalid level may be input to the first clock signal terminal CK1 and the signal input terminal In. The second input circuit 12 may transmit the active level of the second power supply terminal VGH to the fifth node N5 under the action of the second clock signal terminal CK2, the fourth node N4 maintains the invalid level of the previous stage, the sixth node N6 maintains the active level of the previous stage, and the second output circuit 22 transmits the invalid level of the third power supply terminal LVGL to the first output terminal Out1 under the action of the active level of the sixth node N6. In a third stage, the active level is input to the first clock signal terminal CK1, the invalid level is input to the second clock signal terminal CK2, and the signal input terminal In. The first input circuit 11 transmits the invalid level of the signal input terminal In to the fourth node N4 under the action of the first clock signal terminal CK1. The fifth node N5 maintains the active level of the previous stage, and the pull-up circuit 3 transmits the active level of the first clock signal terminal CK1 to the sixth node N6 under the action of the active levels of the fifth node N5 and the first clock signal terminal CK1. The second output circuit 22 transmits the invalid level of the third power supply terminal LVGL to the first output terminal Out1 under the action of the active level of the sixth node N6. In a fourth stage, the invalid level is input to the first clock signal terminal CK1, the active level is input to the second clock signal terminal CK2, and the signal input terminal In. The second input circuit 12 may transmit the active levels of the second clock signal terminal CK2 and the second power supply terminal VGH to the fifth node N5 under the action of the signal input terminal In and the second clock signal terminal CK2, the fourth node N4 maintains the invalid level of the previous stage, the sixth node N6 maintains the active level of the previous stage, and the second output circuit 22 transmits the invalid level of the third power supply terminal LVGL to the first output terminal Out1 under the action of the active level of the sixth node N6. In a fifth stage, the invalid level is input to the second clock signal terminal CK2, the active level is input to the first clock signal terminal Ck1, and the signal input terminal In. The first input circuit 11 transmits the active level of the signal input terminal In to the fourth node N4 under the action of the first clock signal terminal CK1. The pull-down circuit 4 transmits the invalid level of the third power supply terminal LVGL to the sixth node N6 under the action of the fourth node N4. The first output circuit 21 transmits the active level of the second power supply terminal VGH to the first output terminal Out1 under the action of the fourth node N4. In a sixth stage, the invalid level is input to the first clock signal terminal CK1, and the signal input terminal In, and the active level is input to the second clock signal terminal CK2. The second input circuit 12 may transmit the active level of the second power supply terminal VGH to the fifth node N5 under the action of the second clock signal terminal CK2. The sixth node N6 maintains the invalid level of the previous stage, and the fourth node N4 maintains the active level of the previous stage. The first output circuit 21 transmits the active level of the second power supply terminal VGH to the first output terminal Out1 under the action of the fourth node N4. In a seventh stage, the invalid level is input to the second clock signal terminal CK2, the signal input terminal In, and the active level is input to the first clock signal terminal CK1. The first input circuit 11 transmits the invalid level of the signal input terminal In to the fourth node N4 under the action of the first clock signal terminal CK1. The pull-up circuit 3 transmits the active level of the first clock signal terminal CK1 to the sixth node N6 under the action of the fifth node N5 and the first clock signal terminal CK1, and the second output circuit 22 transmits the inactive level of the third power supply terminal LVGL to the first output terminal Out1 under the action of the active level of the sixth node N6. This shift register unit may achieve signal shift output.

In the present exemplary embodiment, as shown in FIG. 6*a*, the first input circuit 11 may include: a fourth transistor T4, a fifth transistor T5, a first electrode of the fourth transistor T4 is connected to the signal input terminal In, a second electrode of the fourth transistor T4 is connected to the seventh node N7, and a gate electrode of the fourth transistor T4 is connected to the first clock signal terminal CK1; a first electrode of the fifth transistor T5 is connected to the seventh node N7, a second electrode of the fifth transistor T5 is connected to the fourth node N4, and a gate electrode of the fifth transistor T5 is connected to the first clock signal terminal CK1. The second input circuit 12 includes a seventh transistor T7, an eighth transistor T8, and a ninth transistor T9. A first electrode of the seventh transistor T7 is connected to the second power supply terminal VGH, a second electrode of the seventh transistor T7 is connected to the fifth node N5, and a gate electrode of the seventh transistor T7 is connected to the second clock signal terminal CK2; a first electrode of the eighth transistor T8 is connected to the fifth node N5, a second electrode of the eighth transistor T8 is connected to the eighth node N8, and a gate electrode of the eighth transistor T8 is connected to the signal input terminal In; a first electrode of the ninth transistor T9 is connected to the eighth node N8, a second electrode of the ninth transistor T9 is connected to the second clock signal terminal CK2, and a gate electrode of the ninth transistor T9 is connected to the signal input terminal In.

In the present exemplary embodiment, as shown in FIG. 6*a*, the shift register unit further includes a first isolation circuit 51 and a second isolation circuit 52, the first isolation circuit 51 is connected to the second power supply terminal VGH, the fourth node N4, and the seventh node N7, and is configured to transmit the signal of the second power supply terminal VGH to the seventh node N7 in response to the signal of the fourth node N4; the second isolation circuit 52 is connected to the eighth node N8, the second power supply terminal VGH, and the fifth node N5, and is configured to transmit the signal of the second power supply terminal VGH to the eighth node N8 in response to the signal of the fifth node N5.

In the present exemplary embodiment, as shown in FIG. 6*a*, the first isolation circuit 51 may include: a sixth transistor T6, a first electrode of the sixth transistor T6 is connected to the seventh node N7, a second electrode of the sixth transistor T6 is connected to the second power supply terminal VGH, and a gate electrode of the sixth transistor T6 is connected to the fourth node N4; the second isolation circuit 52 may include: a tenth transistor T10, a first electrode of the tenth transistor T10 is connected to the second power supply terminal VGH, a second electrode of the tenth transistor T10 is connected to the eighth node N8, and a gate electrode of the tenth transistor T10 is connected to the fifth node N5.

In the present exemplary embodiment, as shown in FIG. 6*a*, the pull-up circuit 3 may include: an eleventh transistor T11, a twelfth transistor T12, and a first capacitor C1. A first electrode of the eleventh transistor T11 is connected to the first clock signal terminal CK1, the second electrode of the eleventh transistor T11 is connected to the ninth node N9, and a gate electrode of the eleventh transistor T11 is connected to the fifth node N5; a first electrode of the twelfth transistor T12 is connected to the ninth node N9, a second electrode of the twelfth transistor T12 is connected to the sixth node N6, and a gate electrode of the twelfth transistor T12 is connected to the first clock signal terminal CK1; the first capacitor C1 may be connected between the fifth node N5 and the ninth node. The pull-down circuit 4 may include: a thirteenth transistor T13, a first electrode of the thirteenth transistor T13 is connected to the third power supply terminal LVGL, a second electrode of the thirteenth transistor T13 is connected to the sixth node N6, and a gate electrode of the thirteenth transistor T13 is connected to the fourth node N4. The first capacitor C1 may further be connected between the fifth node N5 and other signal terminals.

In the present exemplary embodiment, as shown in FIG. 6*a*, the first output circuit 21 may further be connected to a second output terminal Out2, and is configured to transmit the signal of the second power supply terminal VGH to the second output terminal Out2 in response to the signal of the fourth node N4; The second output circuit 22 may further be connected to the second output terminal Out2 and a fourth power supply terminal VGL, and is configured to transmit a signal of the fourth power supply terminal VGL to the second output terminal Out2 in response to the signal of the sixth node N6.

In the present exemplary embodiment, as shown in FIG. 6*a*, the first output circuit 21 may include a fourteenth transistor T14, a fifteenth transistor T15, and a second capacitor C2, a first electrode of the fourteenth transistor T14 is connected to the second power supply terminal VGH, a second electrode of the fourteenth transistor T14 is connected to the first output terminal Out1, and a gate electrode of the fourteenth transistor T14 is connected to the fourth node N4; a first electrode of the fifteenth transistor T15 is connected to the second power supply terminal VGH, a second electrode of the fifteenth transistor T15 is connected to the second output terminal Out2, and a gate electrode of the fifteenth transistor T15 is connected to the fourth node N4; the second capacitor C2 may be connected between the fourth node N4 and the first output terminal Out1. The second output circuit 22 may include: a sixteenth transistor T16, a seventeenth transistor T17, and a third capacitor C3. A first electrode of the sixteenth transistor T16 is connected to the third power supply terminal LVGL, a second electrode of the sixteenth transistor T16 is connected to the first output terminal Out1, and a gate electrode of the sixteenth transistor T16 is connected to the sixth node N6; a first electrode of the seventeenth transistor T17 is connected to the fourth power supply terminal VGL, a second electrode of the seventeenth transistor T17 is connected to the second output terminal Out2, and a gate electrode of the seventeenth transistor T17 is connected to the sixth node N6; the third capacitor C3 may be connected between the sixth node N6 and the third power supply terminal LVGL. In other exemplary embodiments, the second capacitor C2 may further be connected between the fourth node N4 and other signal terminals, and the third capacitor C3 may further be connected between the sixth node N6 and other signal terminals.

In the present exemplary embodiment, as shown in FIG. 6*a*, the shift register unit may further include a reset circuit 6, the reset circuit 6 may be connected to the fourth node N4, the first clock signal terminal CK1, a reset signal terminal TRS, the second power supply terminal VGH, and the sixth node, and configured to transmit the signal of the first clock signal terminal CK1 to the fourth node N4 in response to a signal of the reset signal terminal TRS, and to transmit the signal of the second power supply terminal VGH to the sixth node N6 in response to the signal of the reset signal terminal TRS.

In the present exemplary embodiment, as shown in FIG. 6*a*, the reset circuit 6 may include: an eighteenth transistor T18, a nineteenth transistor T19, and a twentieth transistor T20. A first electrode of the eighteenth transistor T18 is connected to the fourth node N4, a second electrode of the eighteenth transistor T18 is connected to the tenth node N10, and a gate electrode of the eighteenth transistor T18 is connected to the reset signal terminal TRS; a first electrode of the nineteenth transistor T19 is connected to the tenth node N10, a second electrode of the nineteenth transistor T19 is connected to the first clock signal terminal CK1, and a gate electrode of the nineteenth transistor T19 is connected to the reset signal terminal TRS; a first electrode of the twentieth transistor T20 is connected to the second power supply terminal VGH, a second electrode of the twentieth transistor T20 is connected to the sixth node N6, and a gate electrode of the twentieth transistor T20 is connected to the reset signal terminal TRS; the seventh node N7 is connected to the tenth node N10.

In the present exemplary embodiment, as shown in FIG. 6*a*, the fourth transistor T4 to the twentieth transistor T20 may all be N-type transistors. Correspondingly, active driving levels of the first input circuit 11, the second input circuit 12, the pull-up circuit 3, the first output circuit 21, and the second output circuit 22 are high levels, and that is, the first input circuit 11, the second input circuit 12, the pull-up circuit 3, the first output circuit 21, and the second output circuit 22 may be turned on under the action of high level. In the present exemplary embodiment, the second power supply terminal VGH may be a high-level signal terminal, and the fourth power supply terminal VGL and the third power supply terminal LVGL may be low-level signal terminals.

Figure 6B:
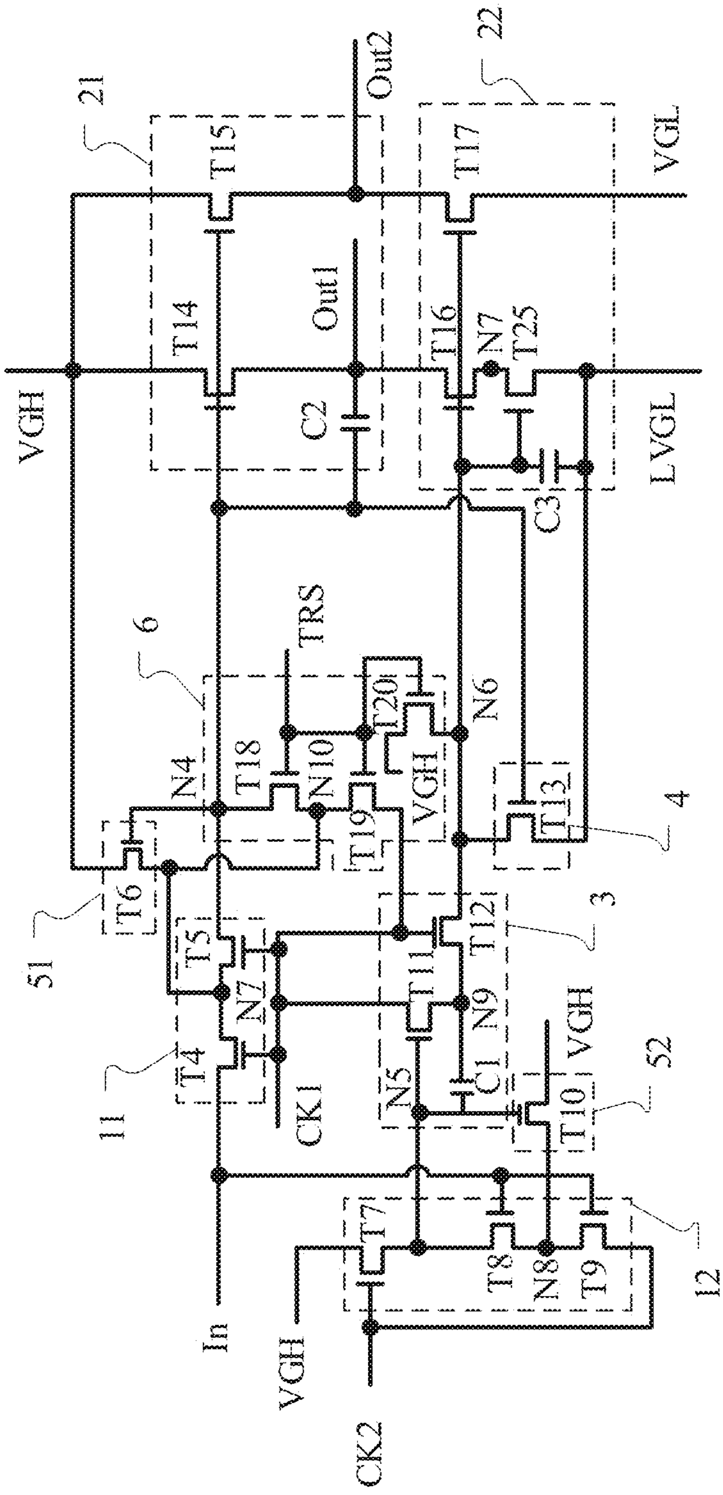
FIG. 6*b* is a structural diagram of another exemplary embodiment of a shift register unit in FIG. 5.

As shown in FIG. 6*b*, it is a schematic diagram of another exemplary embodiment of a shift register unit in FIG. 5. Compared with the shift register unit shown in FIG. 6*a*, in the shift register unit shown in FIG. 6*b*, the second output circuit 22 in the shift register unit shown in FIG. 6*b* may further include a twenty-fifth transistor T25. A first electrode of the sixteenth transistor T16 is connected to the seventh node N7, a second electrode of the sixteenth transistor T16 is connected to the first output terminal Out1, and a gate electrode of the sixteenth transistor T16 is connected to the sixth node N6; a first electrode of the twenty-fifth transistor T25 is connected to the seventh node N7, a second electrode of the twenty-fifth transistor T25 is connected to the third power supply terminal LVGL, and a gate electrode of the twenty-fifth transistor T25 is connected to the sixth node N6. When the first output terminal Out1 outputs a high level, correspondingly, the fourth node N4 outputs a high level, and the sixth transistor T6 transmits a high level signal of the second power supply terminal VGH to the seventh node N7 under the action of the fourth node N4. The first output terminal Out1 and the seventh node N7 have a small voltage difference, and in this way, the arrangement may reduce the leakage current of the first output terminal Out1 through the sixteenth transistor T16.

Figure 7:
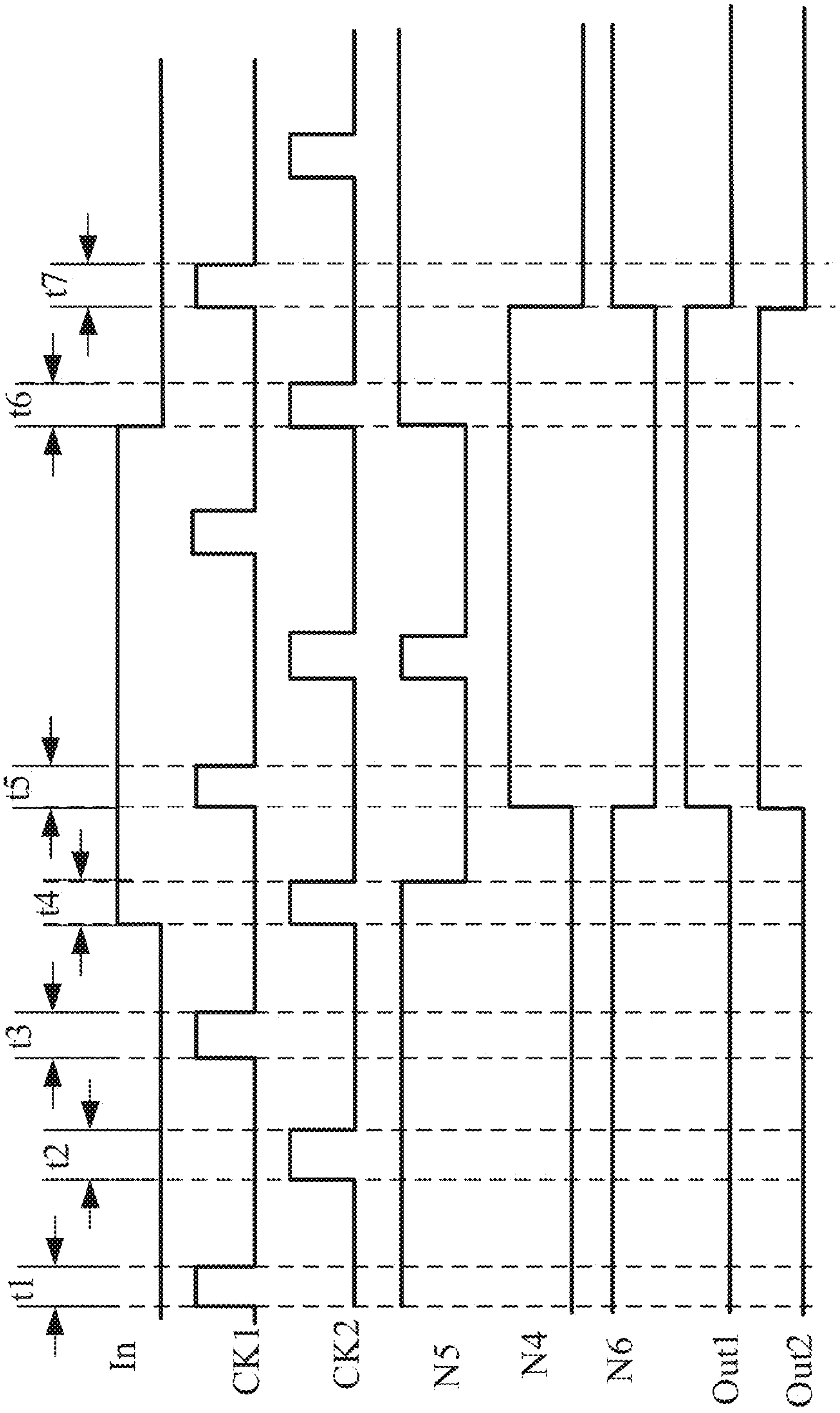
FIG. 7 shows a timing diagram of each node in a method for driving a shift register unit shown in FIG. 6*a;*

As shown in FIG. 7, it is a timing diagram of each node in a method for driving a shift register unit shown in FIG. 6*a* is shown. In is a timing diagram of the input signal input terminal, CK1 is a timing diagram of the first clock signal terminal, CK2 is a timing diagram of the second clock signal terminal, N5 is a timing diagram of the fifth node, N4 is a timing diagram of the fourth node, N6 is a timing diagram of the sixth node, Out1 is a timing diagram of the first output terminal, and Out2 is a timing diagram of the second output terminal.

The method for driving a shift register unit may include seven stages. As shown in FIG. 7, in a first stage t1, the active level is input to the first clock signal terminal Ck1, the invalid level is input to the second clock signal terminal CK2, and the signal input terminal In. The active level is a potential that may drive the target circuit to operate normally. In the present exemplary embodiment, the active level is a high level, and correspondingly, the inactive level is a low level. In the first stage t1, the fourth transistor T4 and the fifth transistor T5 are turned on under the action of the first clock signal terminal CK1, and the signal input terminal In inputs a low-level signal to the fourth node. The fifth node N5 maintains the high-level signal of the previous stage, the eleventh transistor T11 and the twelfth transistor T12 are turned on, the first clock signal terminal CK1 inputs a high-level signal to the sixth node N6, the sixteenth transistor T16 is turned on under the action of the sixth node N6, the third power supply terminal LVGL inputs a low-level signal to the first output terminal Out1, the seventeenth transistor T17 is turned on under the action of the sixth node N6, and the fourth power supply terminal VGL inputs a low-level signal to the second output terminal Out2. In addition, due to the threshold drift of the eighth transistor T8, and a voltage change of the signal input terminal In caused by the voltage rise of the third power supply terminal LVGL, it may cause an increase in a turn-off leakage current of the eighth transistor T8. In the present exemplary embodiment, in the first stage t1, the tenth transistor T10 is turned on under the action of the fifth node N5, and the second power supply terminal VGH inputs a high-level signal to the eighth node N8, and thus this arrangement may reduce a voltage difference between the fifth node N5 and the eighth node N8, thereby reducing a leakage current of the fifth node N5 through the eighth transistor T8.

It should be noted that as shown in FIG. 5, the first output terminal Out1 may be connected to a signal input terminal In of adjacent next level shift register units in cascade, and the second output terminal Out2 may provide the pulse width modulation signal to its corresponding pixel driving circuit row. In the present exemplary embodiment, a voltage of the third power supply terminal LVGL may be less than a voltage of the fourth power supply terminal VGL, and the smaller third power supply terminal LVGL may effectively turn off the eighth transistor in the next level shift register unit, thereby reducing the leakage current of the fifth node. It should be understood that in other exemplary embodiments, the third power supply terminal LVGL may further be shared as a fourth power supply terminal VGL.

In a second stage t2, an active level may be input to the second clock signal terminal CK2, an invalid level may be input to the first clock signal terminal CK1, and the signal input terminal In. The seventh transistor T7 is turned on under the action of the second clock signal terminal CK2, the second power supply terminal VGH inputs a high-level signal to the fifth node N5, the fourth node N4 maintains the low-level signal of the previous stage, the sixth node N6 maintains the high-level signal of the previous stage, the sixteenth transistor T16 is turned on under the action of the sixth node N6, and the third power supply terminal LVGL inputs a low-level signal to the first output terminal Out1, the seventeenth transistor T17 is turned on under the action of the sixth node N6, and the fourth power supply terminal VGL inputs a low-level signal to the second output terminal Out2.

In a third stage t3, the active level is input to the first clock signal terminal CK1, the invalid level is input to the second clock signal terminal CK2, and the signal input terminal In. The fourth transistor T4 and the fifth transistor T5 are turned on under the action of the first clock signal terminal CK1, and the signal input terminal In inputs a low-level signal to the fourth node. The fifth node N5 maintains the high-level signal of the previous stage, the eleventh transistor T11 and the twelfth transistor T12 are turned on, the first clock signal terminal CK1 inputs a high-level signal to the sixth node N6, the sixteenth transistor T16 is turned on under the action of the sixth node N6, the third power supply terminal LVGL inputs a low-level signal to the first output terminal Out1, and the seventeenth transistor T17 is turned on under the action of the sixth node N6, The fourth power supply terminal VGL inputs a low-level signal to the second output terminal Out2.

In a fourth stage t4, the invalid level is input to the first clock signal terminal CK1, the active level is input to the second clock signal terminal CK2, and the signal input terminal In. The seventh transistor T7, the eighth transistor T8, and the ninth transistor T9 are turned on, the second power supply terminal VGH and the second clock signal terminal CK2 both input a high-level signal to the fifth node N5, the fourth node N4 maintains the low-level signal of the previous stage, the sixth node N6 maintains the high-level signal of the previous stage, the sixteenth transistor T16 is turned on under the action of the sixth node N6, the third power supply terminal LVGL inputs a low-level signal to the first output terminal Out1, the seventeenth transistor T17 is turned on under the action of the sixth node N6, and the fourth power supply terminal VGL inputs a low-level signal to the second output terminal Out2.

In a fifth stage t5, the invalid level is input to the second clock signal terminal CK2, the active level is input to the first clock signal terminal Ck1, and the signal input terminal In. The fourth transistor T4 and the fifth transistor T5 are turned on under the action of the first clock signal terminal CK1, the signal input terminal In inputs a high-level signal to the fourth node N4, the fourteenth transistor T14 is turned on under the action of the fourth node N4, the second power supply terminal VGH inputs a high-level signal to the first output terminal Out1, the fifteenth transistor T15 is turned on under the action of the fourth node N4, and the second power supply terminal VGH inputs a high-level signal to the second output terminal Out2. The thirteenth transistor T13 is turned on under the action of the fourth node N4, the third power supply terminal LVGL inputs a low-level signal to the sixth node N6, and the sixteenth transistor T16 and seventeenth transistor T17 are turned off under the action of the sixth node N6. The eighth transistor T8 and ninth transistor T9 are turned on under the action of the signal input terminal In, and the second clock signal terminal CK2 inputs a low-level signal to the fifth node N5. In addition, the sixth transistor T6 is turned on under the action of the fourth node N4, and the second power supply terminal VGH inputs a high-level signal to the seventh node N7 and the tenth node N10. This arrangement may reduce a voltage difference between the fourth node N4 and the seventh node N7, and a voltage difference between the fourth node N4 and the tenth node N10, thereby reducing a leakage current of the fourth node N4 through the fifth transistor T5 and the eighteenth transistor T18.

In a sixth stage t6, an invalid level is input to the first clock signal terminal CK1, and the signal input terminal In, and an active level is input to the second clock signal terminal CK2. The seventh transistor T7 is turned on under the action of the second clock signal terminal CK2, the second power supply terminal VGH inputs a high-level signal to the fifth node N5, the sixth node N6 maintains the low-level signal of the previous stage, and the fourth node N4 maintains the high-level signal of the previous stage. The fourteenth transistor T14 is turned on under the action of the fourth node N4, the second power supply terminal VGH inputs a high-level signal to the first output terminal Out1, the fifteenth transistor T15 is turned on under the action of the fourth node N4, and the second power supply terminal VGH inputs a high-level signal to the second output terminal Out2.

In a seventh stage t7, an invalid level is input to the second clock signal terminal CK2, and the signal input terminal In, and an active level is input to the first clock signal terminal CK1. The fourth transistor T4 and the fifth transistor T5 are turned on, and the signal input terminal In inputs a low-level signal to the fourth node N4. The eleventh transistor T11 is turned on under the action of the fifth node N5, the twelfth transistor T12 is turned on under the action of the first clock signal terminal CK1, and the first clock signal terminal CK1 provides a high-level signal to the sixth node N6. The sixteenth transistor T16 is turned on under the action of the sixth node N6, the third power supply terminal LVGL inputs a low-level signal to the first output terminal Out1, the seventeenth transistor T17 is turned on under the action of the sixth node N6, and the fourth power supply terminal VGL inputs a low-level signal to the second output terminal Out2.

It should be noted that in the present exemplary embodiment, a duration of the high-level pulse output by the signal input terminal In may be adjusted according to actual requirements. During a single high-level pulse period output by the signal input terminal In, the first clock signal terminal CK1 outputs at least one high-level pulse signal, the second clock signal terminal CK2 outputs at least one high-level pulse signal, when the first clock signal terminal CK1 outputs a high-level pulse signal, the second clock signal terminal CK2 outputs a low-level signal, and when the second clock signal terminal CK2 outputs a high-level pulse signal, the first clock signal terminal CK1 outputs a low-level signal. As shown in FIG. 7, during the single high-level pulse period output by the signal input terminal In, the method for driving the shift register unit includes at least the fourth stage t4 and the fifth stage t5.

In the present exemplary embodiment, as shown in FIG. 5, in the first gate electrode driving circuit 81, a first output terminal Out1 of a current stage of the shift register unit is connected to a signal input terminal In of a next stage of the shift register unit adjacent to the current stage of the shift register unit; the first signal input line STUA is connected to a signal input terminal In of a first stage of the shift register unit in the first gate electrode driving circuit; the first clock signal line LC1 is connected to a first clock signal terminal CK1 of an odd-numbered stage shift register unit and a second clock signal terminal CK2 of an even-numbered stage shift register unit in the first gate electrode driving circuit. the second clock signal line LC2 is connected to a first clock signal terminal CK1 of the even-numbered stage shift register unit and a second clock signal terminal CK2 of the odd-numbered stage shift register unit in the first gate electrode driving circuit. In the second gate electrode driving circuit 82, a first output terminal Out1 of a current stage of the shift register unit is connected to a signal input terminal In of a next stage of the shift register unit adjacent to the current stage of the shift register unit; the second signal input line STUB is connected to a signal input terminal In of a first stage of the shift register unit in the second gate electrode driving circuit; the first clock signal line LC1 is connected to a first clock signal terminal CK1 of an odd-numbered stage shift register unit and a second clock signal terminal CK2 of an even-numbered stage shift register unit in the second gate electrode driving circuit. The second clock signal line LC2 is connected to a first clock signal terminal CK1 of the even-numbered stage shift register unit and a second clock signal terminal CK2 of the odd-numbered stage shift register unit in the second gate electrode driving circuit. In addition, the display panel may further include a reset signal line LTRS, and the reset signal line LTRS is connected to the reset signal terminals of all shift register units.

Figure 8:
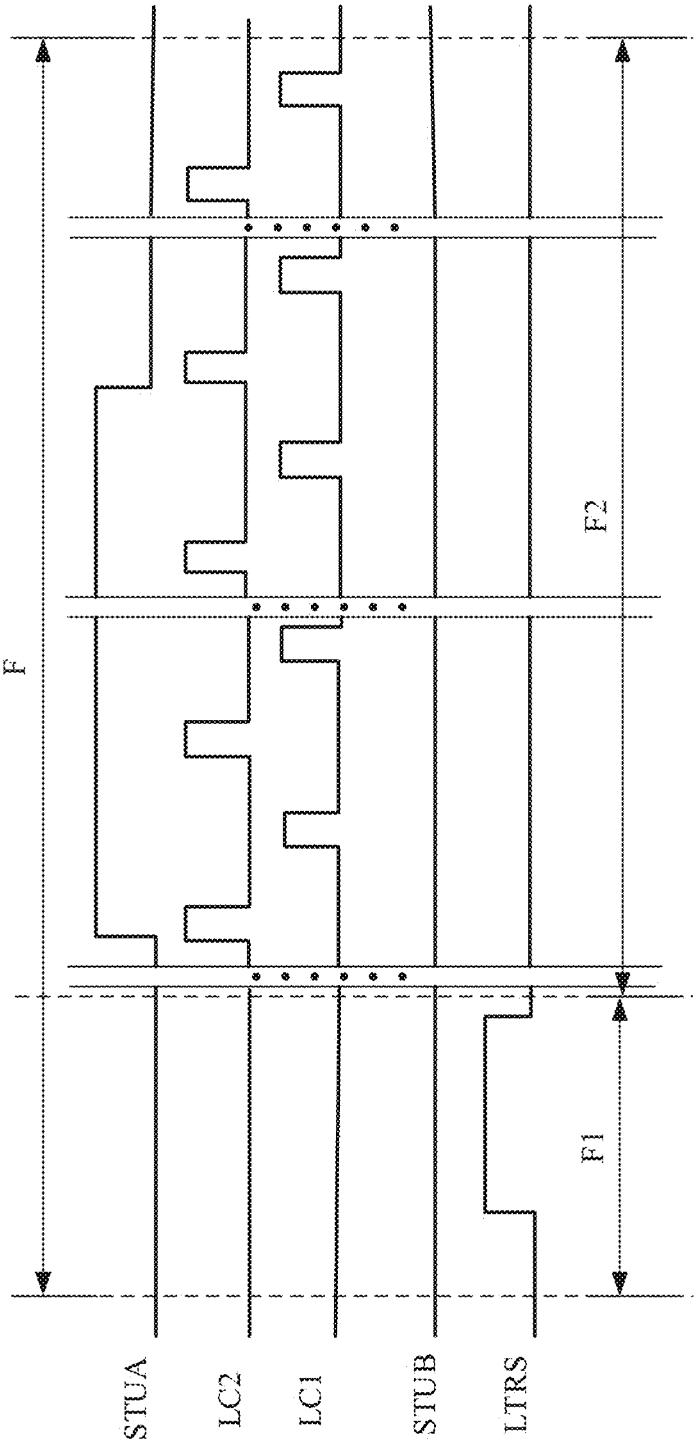
FIG. 8 shows a timing diagram of each signal line in a method for driving a display panel shown in FIG. 5.

As shown in FIG. 8, it is a timing diagram of each signal line in a method for driving the display panel shown in FIG. 5. SUTA is a timing diagram of the first signal input line, STUB is a timing diagram of the second signal input line, LC1 is a timing diagram of the first clock signal line LC1, LC2 is a timing diagram of the second clock signal line, and LTRS is a timing diagram of the reset signal line. In this frame, the first signal input line STUA outputs a high-level pulse signal, and the shift register unit in the first gate electrode driving circuit 81 outputs a pulse width modulation signal step by step to provide a pulse width modulation signal to the odd-numbered pixel driving circuit row by row. The second signal input line STUB continuously outputs a low-level signal, and each shift register unit in the second gate electrode driving circuit 82 continuously outputs a low-level signal. It should be understood that in other frames, the second signal input line STUB may output a high-level pulse signal, and the shift register unit in the second gate electrode driving circuit 82 outputs a pulse width modulation signal step by step to provide a pulse width modulation signal to the even-numbered pixel driving circuit row by row. The first signal input line STUA may continuously output a low-level signal, and each shift register unit in the first gate electrode driving circuit 81 may continuously output a low-level signal. Thus, the display panel may achieve that the first transistor in the odd-numbered pixel driving circuit row and the first transistor in the even-numbered pixel driving circuit row are turned on in a time-division manner, thereby improving the threshold shift problem of the first transistor. In addition, the first gate electrode driving circuit 81 and the second gate electrode driving circuit 82 alternately output a pulse width modulation signal, and this arrangement may further allow sufficient threshold recovery time for transistors such as the fourteenth transistor T14 and the sixteenth transistor T16 in the shift register unit. For example, when the first gate electrode driving circuit 81 outputs a pulse width modulation signal, the gate electrode of the fourteenth transistor T14 in the first gate electrode driving circuit is in the high level for a long time, the gate electrode of the sixteenth transistor T16 is in the low level for a long time, and when the second gate electrode driving circuit 82 outputs a pulse width modulation signal, the gate electrode of the fourteenth transistor T14 in the first gate electrode driving circuit is in the low level for a long time, and the gate electrode of the sixteenth transistor T16 is in the high level for a long time. This arrangement may improve the stability of the gate electrode driving circuit.

As shown in FIG. 8, one frame F includes a blank period F1 and a scanning period F2. The reset signal line LTRS may output a high-level signal in a blank period F1 of a first frame to turn on the eighteenth transistor T18, the nineteenth transistor T19, and the twentieth transistor T20 in all shift register units. Thus, the sixth node N6 is reset through the second power supply terminal VGH, and the fourth node N4 is reset through the first clock signal terminal CK1. At this stage, the signal of the first clock signal terminal CK1 may be a low-level signal. In addition, regions with black dots in FIG. 8 are omitted regions of the timing diagram.

Figure 9:
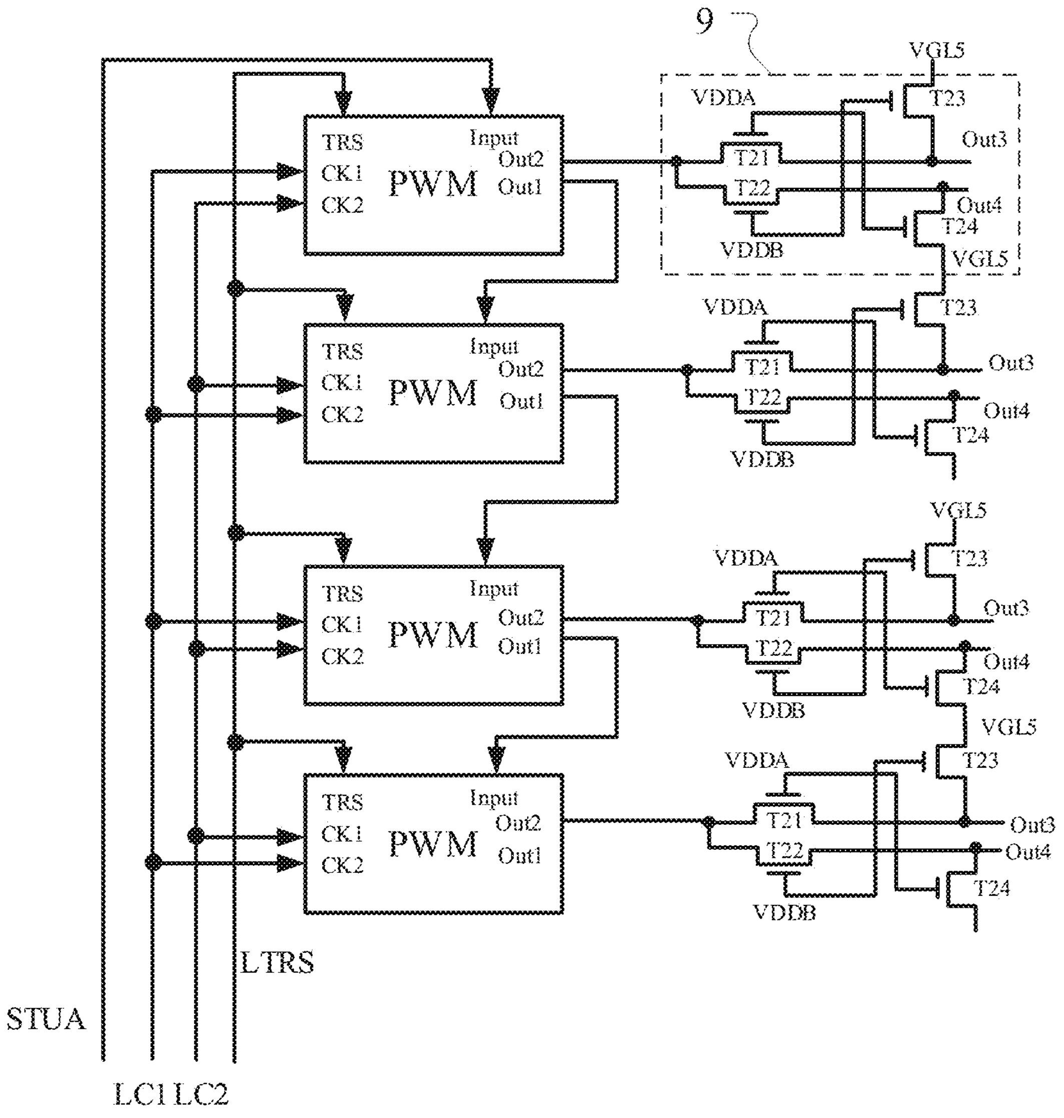
FIG. 9 is a structural diagram of another exemplary embodiment of a gate electrode driving circuit in a display panel of the present disclosure.

In the present exemplary embodiment, as shown in FIG. 9, it is a structural diagram of another exemplary embodiment of a gate electrode driving circuit in a display panel of the present disclosure. The gate electrode driving circuit may further include: a plurality of shift register units PWM cascaded, a plurality of output control circuits 9, the shift register unit PWM is provided in correspondence with the pixel driving circuit group Pz, and the shift register unit PWM is configured to output the pulse width modulation signal through an output terminal; the output control circuit 9 is provided in correspondence with the shift register unit PWM, and is connected to the corresponding output terminal of the shift register unit PWM, a fifth power supply terminal VGL5, a first control signal terminal VDDA, a second control signal terminal VDDB, a third output terminal Out3, and a fourth output terminal Out4, the output control circuit 9 is configured to transmit the pulse width modulation signal of the output terminal of the shift register unit to the third output terminal Out3 in response to a signal of the first control signal terminal VDDA, and to transmit a signal of the fifth power supply terminal VGL5 to the fourth output terminal Out4 in response to the signal of the first control signal terminal VDDA, the output control circuit 9 is further configured to transmit the pulse width modulation signal of the output terminal of the shift register unit to the fourth output terminal Out4 in response to a signal of the second control signal terminal VDDB, and to transmit the signal of the fifth power supply terminal VGL5 to the third output terminal Out3 in response to the signal of the second control signal terminal VDDB. The third output terminal Out3 is configured to provide the pulse width modulation signal to an odd-numbered pixel driving circuit row corresponding to the output control circuit, and the fourth output terminal Out4 is configured to provide the pulse width modulation signal to an even-numbered pixel driving circuit row corresponding to the output control circuit. The pixel driving circuit row and the output control circuit 9 corresponding to the same shift register unit correspond to each other.

In the present exemplary embodiment, as shown in FIG. 9, the output control circuit 9 may include: a twenty-first transistor T21, a twenty-second transistor T22, a twenty-third transistor T23, and a twenty-fourth transistor T24. A first electrode of the twenty-first transistor T21 is connected to the output terminal of a corresponding shift register unit, a second electrode of the twenty-first transistor T21 is connected to the third output terminal Out3, and a gate electrode of the twenty-first transistor T21 is connected to the first control signal terminal VDDA; a first electrode of the twenty-second transistor T22 is connected to the output terminal of a corresponding shift register unit, a second electrode of the twenty-second transistor T22 is connected to the fourth output terminal Out4, and a gate electrode of the twenty-second transistor T22 is connected to the second control signal terminal VDDB; a first electrode of the twenty-third transistor T23 is connected to the fifth power supply terminal VGL5, a second electrode of the twenty-third transistor T23 is connected to the third output terminal Out3, and a gate electrode of the twenty-third transistor T23 is connected to the second control signal terminal VDDB; a first electrode of the twenty-fourth transistor T24 is connected to the fifth power supply terminal VGL5, a second electrode of the twenty-fourth transistor T24 is connected to the fourth output terminal Out4, and a gate electrode of the twenty-fourth transistor T24 is connected to the first control signal terminal VDDA.

In the present exemplary embodiment, the twenty-first transistor T21 to the twenty-fourth transistor T24 may all be N-type transistors, and the fifth power supply terminal VGL5 may be a low-level signal terminal. The shift register unit in the gate electrode driving circuit may be shown in FIG. 6*a*.

Figure 10:
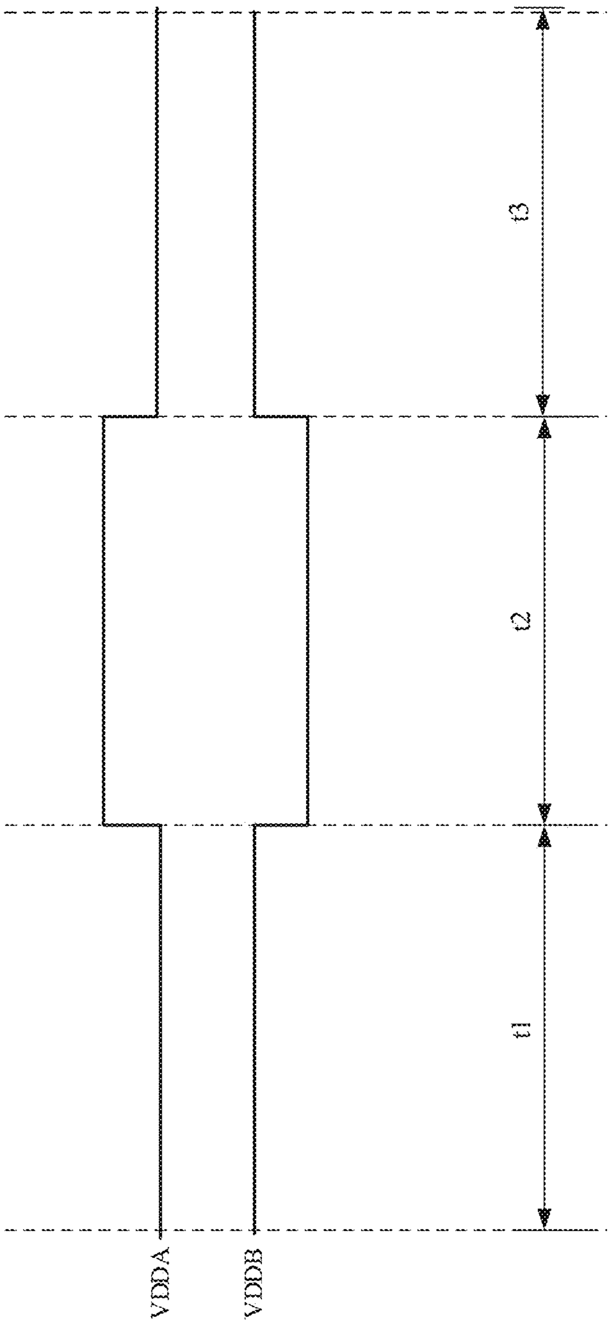
FIG. 10 shows a timing diagram of each node in a method for driving a shift register unit shown in FIG. 9.

As shown in FIG. 10, it is a timing diagram of each node in a method for driving the shift register unit shown in FIG. 9. VDDA is a timing diagram of the first control signal terminal, and VDDB is a timing diagram of the second control signal terminal. The method for driving the shift register unit may include two driving periods: a first driving period t1 and a second driving period t2. During the first driving period t1, a low-level signal is input to the first control signal terminal VDDA, a high-level signal is input to the second control signal terminal VDDB. The twenty-first transistor T21 and twenty-fourth transistor T24 are turned on, the twenty-second transistor T22 and twenty-third transistor T23 are turned off, and the plurality of output control circuits 9 transmit the pulse width modulation signal output by the shift register unit to the odd-numbered pixel driving circuit row. In the second driving period t2, a high-level signal is input to the first control signal terminal VDDA, a low-level signal is input to the second control signal terminal VDDB, the twenty-first transistor T21 and twenty-fourth transistor T24 are turned off, and the twenty-second transistor T22 and twenty-third transistor T23 are turned on. The plurality of output control circuits 9 transmit the pulse width modulation signal output by the shift register unit to the even-numbered pixel driving circuit row. Thus, the display panel may achieve that the first transistor in the odd-numbered pixel driving circuit row and the first transistor in the even-numbered pixel driving circuit row are turned on in a time-division manner, thereby improving the threshold shift problem of the first transistor. The first driving period t1 and second driving period t2 mentioned above may include one or more frames. The voltages of the first control signal terminal VDDA and the second control signal terminal VDDB at the high level stage may be equal to the voltage of the second power supply terminal VGH in the shift register unit, and the voltage of the first control signal terminal VDDA and the second control signal terminal VDDB at the low level stage may be equal to the voltage of the third power supply terminal LVGL in the shift register unit.

This exemplary embodiment further provides a method for driving a display panel, which is configured to drive the aforementioned display panel. The method for driving the display panel includes:

providing the pulse width modulation signal to the pixel driving circuit subgroup in the same pixel driving circuit group in the same frame, where a part of the pixel driving circuit rows form the pixel driving circuit subgroup, and providing the pulse width modulation signal to different pixel driving circuit subgroups in the same pixel driving circuit group in at least a part of different frames.

The driving method has already described in detail in above embodiments, which is not repeated herein.

This exemplary embodiment further provides a display apparatus, and the display apparatus may include the aforementioned display panel. The display apparatus may be a display apparatus for a mobile phone, a tablet, and a television.

Other embodiments of the present disclosure will be apparent to those skilled in the art from consideration of the specification and practice of the invention disclosed here. This disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A display panel, comprising:

a plurality of pixel driving circuits distributed in an array along a first direction and a second direction, wherein the first direction and the second direction intersects, the plurality of pixel driving circuits form a plurality of pixel driving circuit groups, each pixel driving circuit group comprises a plurality of pixel driving circuit rows, and the pixel driving circuit row comprises a plurality of pixel driving circuits distributed along the first direction, and the pixel driving circuit comprises:

a driving circuit, connected to a first node, a second node, and a third node, and configured to input a driving current to the third node through the second node in response to a signal of the first node;

a first switching unit with a first end connected to a first power supply terminal and a second end connected to the second node, configured to connect the first power supply terminal and the second node in response to a pulse width modulation signal;

wherein in a same pixel driving circuit group, a second end of any one of first switching units is connected to a second end of another one of the first switching units in each of the other pixel driving circuit rows.

2. The display panel according to claim 1, wherein the driving circuit comprises:

a driving transistor with a first electrode connected to the second node, a second electrode connected to the third node, and a gate electrode connected to the first node;

the first switching unit comprises:

a first transistor with a first electrode connected to the first power supply terminal, a second electrode connected to the second node, and a gate electrode connected to a pulse width modulation signal terminal;

the pixel driving circuit further comprises:

a second transistor, with a first electrode connected to a data signal terminal, a second electrode connected to the first node, and a gate electrode connected to a first gate electrode driving signal terminal;

a third transistor, with a first electrode connected to the third node, a second electrode connected to a sensing signal terminal, and a gate electrode connected to a second gate electrode driving signal terminal; and a capacitor connected between the first node and the third node.

3. The display panel according to claim 1, further comprising:

a gate electrode driving circuit, wherein the gate electrode driving circuit comprises a plurality of output terminals, the output terminal is provided in correspondence with the pixel driving circuit row, and configured to provide the pulse width modulation signal to a control terminal of the first switching unit in a pixel driving circuit row corresponding to the output terminal;

the gate electrode driving circuit is configured to provide the pulse width modulation signal to a pixel driving circuit subgroup in a same pixel driving circuit group in a same frame, a part of the pixel driving circuit rows in the pixel driving circuit group form the pixel driving circuit subgroup, and the gate electrode driving circuit is configured to provide the pulse width modulation signal to different pixel driving circuit subgroups of the same pixel driving circuit group in at least a part of different frames.

4. The display panel according to claim 3, wherein the pixel driving circuit subgroup comprises one pixel driving circuit row, the pixel driving circuit group comprises an odd-numbered pixel driving circuit row located in an odd row and an even-numbered pixel driving circuit row located in an even row, and two pixel driving circuit rows in the pixel driving circuit group are adjacent to each other in the second direction;

the gate electrode driving circuit is configured to provide the pulse width modulation signal to the odd-numbered pixel driving circuit row or the even-numbered pixel driving circuit row in the same frame, and the gate electrode driving circuit is configured to provide the pulse width modulation signal to the odd-numbered pixel driving circuit row in at least a part of the frames, and to provide the pulse width modulation signal to the even-numbered pixel driving circuit row in at least a part of the frames.

5. The display panel according to claim 4, wherein the gate electrode driving circuit comprises:

a first gate electrode driving circuit, connected to a first signal input line, a first clock signal line, and a second clock signal line, and configured to provide the pulse width modulation signal to the odd-numbered pixel driving circuit row in response to signals of the first signal input line, the first clock signal line, and the second clock signal line; and a second gate electrode driving circuit, connected to a second signal input line, the first clock signal line, and the second clock signal line, and configured to provide the pulse width modulation signal to the even-numbered pixel driving circuit row in response to signals of the second signal input line, the first clock signal line, and the second clock signal line.

6. The display panel according to claim 5, wherein the first gate electrode driving circuit comprises a plurality of shift register units cascaded, and the second gate electrode driving circuit comprises a plurality of shift register units cascaded;

the shift register unit comprises:

a first input circuit, connected to a signal input terminal, a first clock signal terminal, and a fourth node, and configured to transmit a signal of the signal input terminal to the fourth node in response to a signal of the first clock signal terminal;

a second input circuit, connected to a second power supply terminal, a second clock signal terminal, a fifth node, and the signal input terminal, wherein the second input circuit is configured to transmit a signal of the second power supply terminal to the fifth node in response to a signal of the second clock signal terminal, and configured to transmit the signal of the second clock signal terminal to the fifth node in response to the signal of the signal input terminal;

a pull-up circuit, connected to the first clock signal terminal, the fifth node, and a sixth node, and configured to transmit the signal of the first clock signal terminal to the sixth node in response to a signal of the fifth node and the signal of the first clock signal terminal;

a pull-down circuit, connected to the fourth node, a third power supply terminal, and the sixth node, and configured to transmit a signal of the third power supply terminal to the sixth node in response to a signal of the fourth node;

a first output circuit, connected to the fourth node, a first output terminal, and a second power supply terminal, configured to transmit the signal of the second power supply terminal to the first output terminal in response to the signal of the fourth node; and a second output circuit, connected to the sixth node, the third power supply terminal, and the first output terminal, and configured to transmit the signal of the third power supply terminal to the first output terminal in response to a signal of the sixth node.

7. The display panel according to claim 6, wherein the first input circuit comprises:

a fourth transistor, with a first electrode connected to the signal input terminal, a second electrode connected to a seventh node, and a gate electrode connected to the first clock signal terminal;

a fifth transistor, with a first electrode connected to the seventh node, a second electrode connected to the fourth node, and a gate electrode connected to the first clock signal terminal;

the second input circuit comprises:

a seventh transistor, with a first electrode connected to the second power supply terminal, a second electrode connected to the fifth node, and a gate electrode connected to the second clock signal terminal;

an eighth transistor, with a first electrode connected to the fifth node, a second electrode connected to an eighth node, and a gate electrode connected to the signal input terminal; and a ninth transistor, with a first electrode connected to the eighth node, a second electrode connected to the second clock signal terminal, and a gate electrode connected to the signal input terminal.

8. The display panel according to claim 7, wherein the shift register unit further comprises:

a first isolation circuit, connected to the second power supply terminal, the fourth node, and the seventh node, and configured to transmit the signal of the second power supply terminal to the seventh node in response to the signal of the fourth node; and a second isolation circuit, connected to the eighth node, the second power supply terminal, and the fifth node, and configured to transmit the signal of the second power supply terminal to the eighth node in response to the signal of the fifth node.

9. The display panel according to claim 8, wherein the first isolation circuit comprises:

a sixth transistor, with a first electrode connected to the seventh node, a second electrode connected to the second power supply terminal, and a gate electrode connected to the fourth node;

the second isolation circuit comprises:

a tenth transistor, with a first electrode connected to the second power supply terminal, a second electrode connected to the eighth node, and a gate electrode connected to the fifth node.

10. The display panel according to claim 8, wherein the second output circuit comprises:

a sixteenth transistor, with a first electrode connected to the seventh node, a second electrode connected to the first output terminal, and a gate electrode connected to the sixth node;

a twenty-fifth transistor, with a first electrode connected to the seventh node, a second electrode connected to the third power supply terminal, and a gate electrode connected to the sixth node; and a third capacitor, connected to the sixth node.

11. The display panel according to claim 4, wherein the gate electrode driving circuit comprises:

a plurality of shift register units cascaded, wherein the shift register unit is provided in correspondence with the pixel driving circuit group and configured to output the pulse width modulation signal through an output terminal;

a plurality of output control circuits, wherein the output control circuit is provided in correspondence with the shift register unit, and the output control circuit is connected to the output terminal of of a corresponding shift register unit, a fifth power supply terminal, a first control signal terminal, a second control signal terminal, a third output terminal, and a fourth output terminal, the output control circuit is configured to transmit the pulse width modulation signal of the output terminal of the shift register unit to the third output terminal in response to a signal of the first control signal terminal, and to transmit a signal of the fifth power supply terminal to the fourth output terminal in response to the signal of the first control signal terminal, the output control circuit is further configured to transmit the pulse width modulation signal of the output terminal of the shift register unit to the fourth output terminal in response to a signal of the second control signal terminal, and to transmit the signal of the fifth power supply terminal to the third output terminal in response to the signal of the second control signal terminal;

the third output terminal and the fourth output terminal form an output terminal of the gate electrode driving circuit, the third output terminal is configured to provide the pulse width modulation signal to an odd-numbered pixel driving circuit row corresponding to the output control circuit, and the fourth output terminal is configured to provide the pulse width modulation signal to an even-numbered pixel driving circuit row corresponding to the output control circuit;

wherein the output control circuit comprises:

a twenty-first transistor, with a first electrode connected to the output terminal of the corresponding shift register unit, a second electrode connected to the third output terminal, and a gate electrode connected to the first control signal terminal;

a twenty-second transistor, with a first electrode connected to the output terminal of the corresponding shift register unit, a second electrode connected to the fourth output terminal, and a gate electrode connected to the second control signal terminal;

a twenty-third transistor, with a first electrode connected to the fifth power supply terminal, a second electrode connected to the third output terminal, and a gate electrode connected to the second control signal terminal; and a twenty-fourth transistor with a first electrode connected to the fifth power supply terminal, a second electrode connected to the fourth output terminal, and a gate electrode connected to the first control signal terminal.

12. The display panel according to claim 6, wherein the pull-up circuit comprises:

an eleventh transistor, with a first electrode connected to the first clock signal terminal, a second electrode connected to the ninth node, and a gate electrode connected to the fifth node;

a twelfth transistor, with a first electrode connected to the ninth node, a second electrode connected to the sixth node, and a gate electrode connected to the first clock signal terminal; and a first capacitor, connected to the fifth node;

the pull-down circuit comprises:

a thirteenth transistor, with a first electrode connected to the third power supply terminal, a second electrode connected to the sixth node, and a gate electrode connected to the fourth node.

13. The display panel according to claim 6, wherein the first output circuit is further connected to a second output terminal, and configured to transmit the signal of the second power supply terminal to the second output terminal in response to the signal of the fourth node;

the second output circuit is further connected to the second output terminal and a fourth power supply terminal, and configured to transmit a signal of the fourth power supply terminal to the second output terminal in response to the signal of the sixth node;

the first output terminal or the second output terminal forms an output terminal of the gate electrode driving circuit.

14. The display panel according to claim 13, wherein active driving levels of the first input circuit, the second input circuit, the pull-up circuit, the first output circuit, and the second output circuit are high levels;

the second power supply terminal is a high-level signal terminal, the fourth power supply terminal and the third power supply terminal are both low-level signal terminals, and a voltage of the third power supply terminal is less than a voltage of the fourth power supply terminal.

15. The display panel according to claim 13, wherein the first output circuit comprises:

a fourteenth transistor, with a first electrode connected to the second power supply terminal, a second electrode connected to the first output terminal, and a gate electrode connected to the fourth node;

a fifteenth transistor, with a first electrode connected to the second power supply terminal, a second electrode connected to the second output terminal, and a gate electrode connected to the fourth node;

a second capacitor, connected to the fourth node;

the second output circuit comprises:

a sixteenth transistor, with a first electrode connected to the third power supply terminal, a second electrode connected to the first output terminal, and a gate electrode connected to the sixth node;

a seventeenth transistor, with a first electrode connected to the fourth power supply terminal, a second electrode connected to the second output terminal, and a gate electrode connected to the sixth node; and a third capacitor, connected to the sixth node.

16. The display panel according to claim 6, wherein the shift register unit further comprises:

a reset circuit, connected to the fourth node, the first clock signal terminal, a reset signal terminal, the second power supply terminal, and the sixth node, and configured to transmit the signal of the first clock signal terminal to the fourth node in response to a signal of the reset signal terminal, and to transmit the signal of the second power supply terminal to the sixth node in response to the signal of the reset signal terminal;

wherein the first input circuit comprises:

a fourth transistor, with a first electrode connected to the signal input terminal, a second electrode connected to the seventh node, and a gate electrode connected to the first clock signal terminal;

a fifth transistor, with a first electrode connected to the seventh node, a second electrode connected to the fourth node, and a gate electrode connected to the first clock signal terminal;

the shift register unit further comprises:

a first isolation circuit, connected to the second power supply terminal, the fourth node, and the seventh node, and configured to transmit the signal of the second power supply terminal to the seventh node in response to the signal of the fourth node;

the reset circuit comprises:

an eighteenth transistor, with a first electrode connected to the fourth node, a second electrode connected to a tenth node, and a gate electrode connected to the reset signal terminal;

a nineteenth transistor, with a first electrode connected to the tenth node, a second electrode connected to the first clock signal terminal, and a gate electrode connected to the reset signal terminal; and a twentieth transistor, with a first electrode connected to the second power supply terminal, a second electrode connected to the sixth node, and a gate electrode connected to the reset signal terminal;

wherein the seventh node is connected to the tenth node.

17. The display panel according to claim 6, wherein in the first gate electrode driving circuit:

a first output terminal of a current stage of the shift register unit is connected to a signal input terminal of a next stage of the shift register unit adjacent to the current stage of the shift register unit;

the first signal input line is connected to a signal input terminal of a first stage of the shift register unit in the first gate electrode driving circuit;

the first clock signal line is connected to a first clock signal terminal of an odd-numbered stage shift register unit and a second clock signal terminal of an even-numbered stage shift register unit in the first gate electrode driving circuit, and the second clock signal line is connected to a first clock signal terminal of the even-numbered stage shift register unit and a second clock signal terminal of the odd-numbered stage shift register unit in the first gate electrode driving circuit;

in the second gate electrode driving circuit:

a first output terminal of a current stage of the shift register unit is connected to a signal input terminal of a next stage of the shift register unit adjacent to the current stage of the shift register unit;

the second signal input line is connected to a signal input terminal of a first stage of the shift register unit in the second gate electrode driving circuit;

the first clock signal line is connected to a first clock signal terminal of an odd-numbered stage shift register unit and a second clock signal terminal of an even-numbered stage shift register unit in the second gate electrode driving circuit, and the second clock signal line is connected to a first clock signal terminal of the even-numbered stage shift register unit and a second clock signal terminal of the odd-numbered stage shift register unit in the second gate electrode driving circuit.

18. The display panel according to claim 1, wherein the pixel driving circuit group comprises a plurality of pixel driving circuit rows adjacent to each other in the second direction, and in a same pixel driving circuit group, the second ends of the first switching units of the plurality of pixel driving circuits distributed in the second direction are connected to each other.

19. A method for driving a display panel, wherein the method for driving the display panel is configured to drive the display panel, and the display panel comprises:

a plurality of pixel driving circuits distributed in an array along a first direction and a second direction, wherein the first direction and the second direction intersects, the plurality of pixel driving circuits form a plurality of pixel driving circuit groups, each pixel driving circuit group comprises a plurality of pixel driving circuit rows, and the pixel driving circuit row comprises a plurality of pixel driving circuits distributed along the first direction, and the pixel driving circuit comprises:

a driving circuit, connected to a first node, a second node, and a third node, and configured to input a driving current to the third node through the second node in response to a signal of the first node;

a first switching unit with a first end connected to a first power supply terminal and a second end connected to the second node, configured to connect the first power supply terminal and the second node in response to a pulse width modulation signal;

wherein in a same pixel driving circuit group, a second end of any one of first switching units is connected to a second end of another one of the first switching units in each of the other pixel driving circuit rows, the method for driving the display panel comprises:

providing the pulse width modulation signal to the pixel driving circuit subgroup in the same pixel driving circuit group in the same frame, wherein a part of the pixel driving circuit rows form the pixel driving circuit subgroup, and providing the pulse width modulation signal to different pixel driving circuit subgroups in the same pixel driving circuit group in at least a part of different frames.

20. A display apparatus comprising a display panel, and the display panel comprises:

a plurality of pixel driving circuits distributed in an array along a first direction and a second direction, wherein the first direction and the second direction intersects, the plurality of pixel driving circuits form a plurality of pixel driving circuit groups, each pixel driving circuit group comprises a plurality of pixel driving circuit rows, and the pixel driving circuit row comprises a plurality of pixel driving circuits distributed along the first direction, and the pixel driving circuit comprises:

a driving circuit, connected to a first node, a second node, and a third node, and configured to input a driving current to the third node through the second node in response to a signal of the first node;

a first switching unit with a first end connected to a first power supply terminal and a second end connected to the second node, configured to connect the first power supply terminal and the second node in response to a pulse width modulation signal;

wherein in a same pixel driving circuit group, a second end of any one of first switching units is connected to a second end of another one of the first switching units in each of the other pixel driving circuit rows.

* * * * *